US 7,948,616 B2

(12) United States Patent
Miyashita

(10) Patent No.: US 7,948,616 B2
(45) Date of Patent: May 24, 2011

(54) MEASUREMENT METHOD, EXPOSURE METHOD AND DEVICE MANUFACTURING METHOD

(75) Inventor: Kazuyuki Miyashita, Tokyo (JP)

(73) Assignee: Nikon Corporation, Tokyo (JP)

(*) Notice: Subject to any disclaimer, the term of this patent is extended or adjusted under 35 U.S.C. 154(b) by 302 days.

(21) Appl. No.: 12/081,201

(22) Filed: Apr. 11, 2008

(65) Prior Publication Data

US 2008/0259353 A1 Oct. 23, 2008

Related U.S. Application Data

(60) Provisional application No. 60/924,107, filed on Apr. 30, 2007.

(30) Foreign Application Priority Data

Apr. 12, 2007 (JP) ................................. 2007-105362

(51) Int. Cl.
*G01B 9/00* (2006.01)
(52) U.S. Cl. .......................................... 356/124; 430/30
(58) Field of Classification Search .......... 356/124–127, 356/399–401, 614; 355/53, 55, 77; 430/30, 430/296
See application file for complete search history.

(56) References Cited

U.S. PATENT DOCUMENTS

| 4,759,626 | A | | 7/1988 | Kroko |
| 4,908,656 | A | | 3/1990 | Suwa et al. |
| 5,402,224 | A | * | 3/1995 | Hirukawa et al. ............. 356/124 |
| 5,434,026 | A | | 7/1995 | Takatsu et al. |
| 5,448,332 | A | | 9/1995 | Sakakibara et al. |
| 5,615,006 | A | * | 3/1997 | Hirukawa et al. ............. 356/124 |
| 5,646,413 | A | | 7/1997 | Nishi |
| 5,760,879 | A | * | 6/1998 | Shinonaga et al. ............. 355/55 |
| 6,011,611 | A | | 1/2000 | Nomura et al. |
| 6,611,316 | B2 | | 8/2003 | Sewell |
| 6,706,456 | B2 | * | 3/2004 | Miyashita et al. ............. 430/30 |
| 6,778,257 | B2 | | 8/2004 | Bleeker et al. |
| 6,952,253 | B2 | | 10/2005 | Lof et al. |
| 2001/0053489 | A1 | | 12/2001 | Dirksen et al. |

(Continued)

FOREIGN PATENT DOCUMENTS

EP          1 420 298 A2      5/2004

(Continued)

OTHER PUBLICATIONS

U.S. Appl. No. 12/078,864, filed Apr. 7, 2008 Miyashita.

(Continued)

*Primary Examiner* — Hoa Q Pham
(74) *Attorney, Agent, or Firm* — Oliff & Berridge, PLC

(57) ABSTRACT

An image of an aperture pattern that includes an L/S pattern having a linewidth that exceeds the measurement resolution of a measurement device is generated in each of divided areas on a wafer via an optical system. A part of each of the divided areas on the wafer exposed via a projection optical system, and an image of the aperture pattern after removal of a part of the image of the L/S pattern is formed in each of the divided areas. An image of the pattern that is obtained by removing a part of the pattern is formed in each of the divided areas after the wafer is developed. Measurement is performed by a measurement device using the wafer as a sample, and the optical characteristics of the projection optical system (such as a best focus position, field of curvature, or astigmatism) are obtained.

33 Claims, 12 Drawing Sheets

U.S. PATENT DOCUMENTS

| | | |
|---|---|---|
| 2003/0025890 A1 | 2/2003 | Nishinaga |
| 2004/0179190 A1* | 9/2004 | Miyashita et al. ............ 356/124 |
| 2005/0259234 A1 | 11/2005 | Hirukawa et al. |
| 2005/0280791 A1 | 12/2005 | Nagasaka et al. |
| 2006/0231206 A1 | 10/2006 | Nagasaka et al. |
| 2007/0046929 A1* | 3/2007 | Shiode ......................... 356/124 |
| 2008/0208499 A1* | 8/2008 | Miyashita ....................... 702/82 |

FOREIGN PATENT DOCUMENTS

| | | |
|---|---|---|
| JP | A-03-155112 | 7/1991 |
| JP | A-05-062882 | 3/1993 |
| JP | A-06-117831 | 4/1994 |
| JP | A-06-283403 | 10/1994 |
| JP | A-07-176468 | 7/1995 |
| JP | A-10-303114 | 11/1998 |
| JP | A-11-142108 | 5/1999 |
| JP | A-2001-313250 | 11/2001 |
| JP | A-2004-146702 | 5/2004 |
| JP | A-2004-165307 | 6/2004 |
| JP | A-2004-519850 | 7/2004 |
| JP | A-2004-289126 | 10/2004 |
| WO | WO 99/49504 | 9/1999 |
| WO | WO 01/35168 A1 | 5/2001 |
| WO | WO 2004/055803 A1 | 7/2004 |
| WO | WO 2004/057590 A1 | 7/2004 |
| WO | WO 2004/086468 A1 | 10/2004 |
| WO | WO 2005/029559 A1 | 3/2005 |
| WO | WO 2007/043535 A1 | 4/2007 |

OTHER PUBLICATIONS

International Search Report of PCT/JP2008/000953, dated Jul. 15, 2008.

Written Opinion of the International Searching Authority for PCT/JP2008/000953, dated Jul. 15, 2008, w/English-language translation.

International Search Report of PCT/JP2006/320232, dated Dec. 5, 2006.

Written Opinion of the International Searching Authority for PCT/JP2006/320232, dated Dec. 5, 2006, w/English-language translation.

Supplementary European Search Report for EP 06 81 1544, dated Feb. 16, 2010.

English-language translation of JP-A-2004-146702.

Office Action issued in U.S. Appl. No. 12/078,864, issued Sep. 1, 2010.

Supplementary European Search Report for EP 06 81 1544, dated Feb. 16, 2010.

* cited by examiner

MEASUREMENT METHOD, EXPOSURE METHOD AND DEVICE MANUFACTURING METHOD

CROSS-REFERENCE TO RELATED APPLICATIONS

This non-provisional application claims the benefit of Provisional Application No. 60/924,107 filed Apr. 30, 2007, the disclosure of which is hereby incorporated herein by reference in its entirety.

BACKGROUND OF THE INVENTION

1. Field of the Invention

The present invention relates to measurement methods, exposure methods and device manufacturing methods, and more specifically, to a measurement method of measuring optical characteristics of an optical system that generates a pattern image on a predetermined surface, an exposure method of performing exposure taking into consideration the optical characteristics measured by the measurement method, and a device manufacturing method making use of the exposure method.

2. Description of the Background Art

The integration of semiconductor devices (integrated circuits) and the like is getting higher year by year, and accordingly the much higher resolving power is being required for a projection exposure apparatus, such as a stepper, which is a manufacturing apparatus of semiconductor devices and the like. Further, along with the high resolving power, it is also important to form a targeted pattern on an object to be exposed such as a wafer precisely following the designed value, and to improve the overlay accuracy of patterns of next and subsequent layers with respect to a pattern that has been already formed on the object to be exposed. For this purpose, optical characteristics of a projection optical system needs to be improved, and as the premise, it is important to accurately measure and evaluate the optical characteristics (including image-forming characteristics) of the projection optical system.

Accurate measurement of the optical characteristics of the projection optical system, for example, accurate measurement of an image plane of a pattern can be performed based on the assumption that a best focus position at each evaluation point (measurement point) within a field of the projection optical system can accurately be measured.

As a conventional measurement method of the best focus position of the projection optical system, a so-called CD/Focus method is representatively known. In this method, a predetermined reticle pattern (e.g. a line-and-space pattern or the like) serves as a test pattern and the test pattern is transferred to a test wafer at a plurality of positions in an optical axis direction of the projection optical system. Then, a linewidth value of a resist image (an image of the transferred pattern) that is obtained by developing the test wafer is measured using the scanning electron microscope (SEM) or the like, and the best focus position is computed based on a relation between the linewidth value and the wafer position in the optical axis direction of the projection optical system (hereinafter, also referred to as a "focus position" as needed).

However, in the CD/Focus method described above, for example, in order to measure the linewidth value of the resist image by the SEM, the focusing of the SEM needs to be performed strictly, and therefore it takes a very long time to perform the measurement at one point and several hours to several tens of hours were necessary for performing the measurement at many points. Thus, the throughput until the measurement results can be obtained drastically decreases. In addiction to this situation, the higher level is required also for repeatability of measurement errors or measurement results and therefore it becomes difficult to cope with it by the conventional measurement method.

Besides, a so-called SMP focus measurement method that is disclosed in U.S. Pat. No. 4,908,656 and the like is also known, in which a resist image of a wedge-shaped mark is formed on a wafer at a plurality of focus positions, and the length of the resist image in the longitudinal direction (which is the amplification of the change in the linewidth value of the resist image due to the difference in the focus position) is measured using a mark detection system such as an alignment system and the measurement result is used. In this SMP focus measurement method, however, since the measurement is usually performed using a monochromatic light, the effect of interference differs depending on the difference in shape of a resist image, which leads to measurement error (dimension offset), and also the resolution of the current image-capturing instrument (such as a CCD camera) is still insufficient. Further, it was difficult to increase the number of evaluation points because the test pattern is large in size.

For these reasons, a proposal of a measurement method has been expected, in which the optical characteristics of the optical system can be measured with high throughput using a measurement system having a low resolution, for example, a measurement device such as an alignment sensor based on an image-forming method of an exposure apparatus.

SUMMARY OF THE INVENTION

The inventor earnestly conducted research in order to fulfill the expectation, and as a consequence, he reached the conclusion that not the size of a pattern image (a linewidth or a length) or the like, but some kind of amount that is obtained by processing an imaging signal obtained by picking up the pattern image (e.g. an amount including information of a luminance value of each pixel) can be made to be an index value. Then, he further conducted research in order to decide what pattern image is appropriate as a pattern image for measurement. As a result of this research, it was found that in the case where an image of a line-and-space pattern is employed, for example, as a pattern image for measurement, when the linewidth (to be more precise, a width of a line section and a width of space section, whichever is greater) is less than or equal to around the resolution limit of a measurement system, frame lines that do not exist in actual appear on the periphery of the pattern, which becomes a factor of measurement error.

The present invention has been made in consideration of the situation described above, and according to a first aspect of the present invention, there is provided a first measurement method, comprising: a first process of exposing an object by generating a first pattern image on the object via an optical system; a second process of exposing a part of an area on the object where the first pattern image has been generated via the optical system; a third process of measuring a pattern image that is formed on the object after processing of the second process using a measurement device; and a fourth process of computing an optical characteristic of the optical system using a measurement result of the pattern image.

With this method, by generating a first pattern image on an object via the optical system, the object is exposed. Then, by exposing a part of an area on the object where the first pattern image has been generated by this exposure via the optical system, the part of the first pattern image can be removed.

And, the pattern image obtained by removing the part is measured using the measurement device and the optical characteristics of the optical system are computed using the measurement result. Accordingly, even if the linewidth of the first pattern image is less than or equal to the measurement resolution of the measurement device, it becomes possible to measure the pattern image obtained by removing the part of the first pattern image using the measurement device, and by computing the optical characteristics of the optical system using the measurement result, it becomes possible to measure the optical characteristics with high precision in a short period of time.

According to a second aspect of the present invention, there is provided a second measurement method of measuring an optical characteristic of an optical system that projects a pattern of a first surface on a second surface, the method comprising: performing multiple exposure to each of a plurality of areas on an object by performing exposure to form a dense pattern image on the object via the optical system at each of different positions in an optical axis direction of the optical system and exposure to remove a part of the dense pattern image; and measuring brightness/darkness information of a pattern image in each of the plurality of areas.

With this method, even if the linewidth of the dense pattern image is less than or equal to the measurement resolution of the measurement device, the pattern image obtained by removing a part of the dense pattern image is not less than or equal to the resolution of the measurement device, and accordingly, the phenomenon that frame lines which do not exist in actual appear on the periphery of the pattern and this becomes a factor of measurement error does not occur. Further, brightness/darkness information of the pattern image of each area is measured. As a consequence, the optical characteristics of the optical system can be measured with high precision and high throughput using a measurement system having a low resolution compared with the SEM or the like, for example, a measurement device such as an alignment sensor based on an image-forming method of an exposure apparatus.

According to a third aspect of the present invention, there is provided an exposure method, comprising: a process of measuring an optical characteristic of an optical system by either of the first or second measurement method of the present invention; and a process of adjusting at least one of an optical characteristic of the optical system and a position of the object in an optical axis direction of the optical system taking a measurement result of the optical characteristic into consideration, and also exposing the object via the optical system.

With this method, the optical characteristics of the optical system are measured with high precision in a short period of time by the measurement method of the present invention, and at least one of the optical characteristics of the optical system and the position of the object with respect to the optical system in an optical axis direction of the optical system is adjusted taking the measurement result of the optical characteristics into consideration, and also the object is exposed via the optical system in order to form a pattern. Accordingly, the pattern can be formed with high accuracy on the object.

According to a fourth aspect of the present invention, there is provided a device manufacturing method, including: a process of forming a pattern on an object using the exposure method of the present invention; and a process of processing the object on which the pattern is formed.

BRIEF DESCRIPTION OF THE DRAWINGS

In the accompanying drawings.

DESCRIPTION OF THE EMBODIMENTS

An embodiment of the present invention will be described below, referring to FIGS. 1 to 15B.

Figure 1:
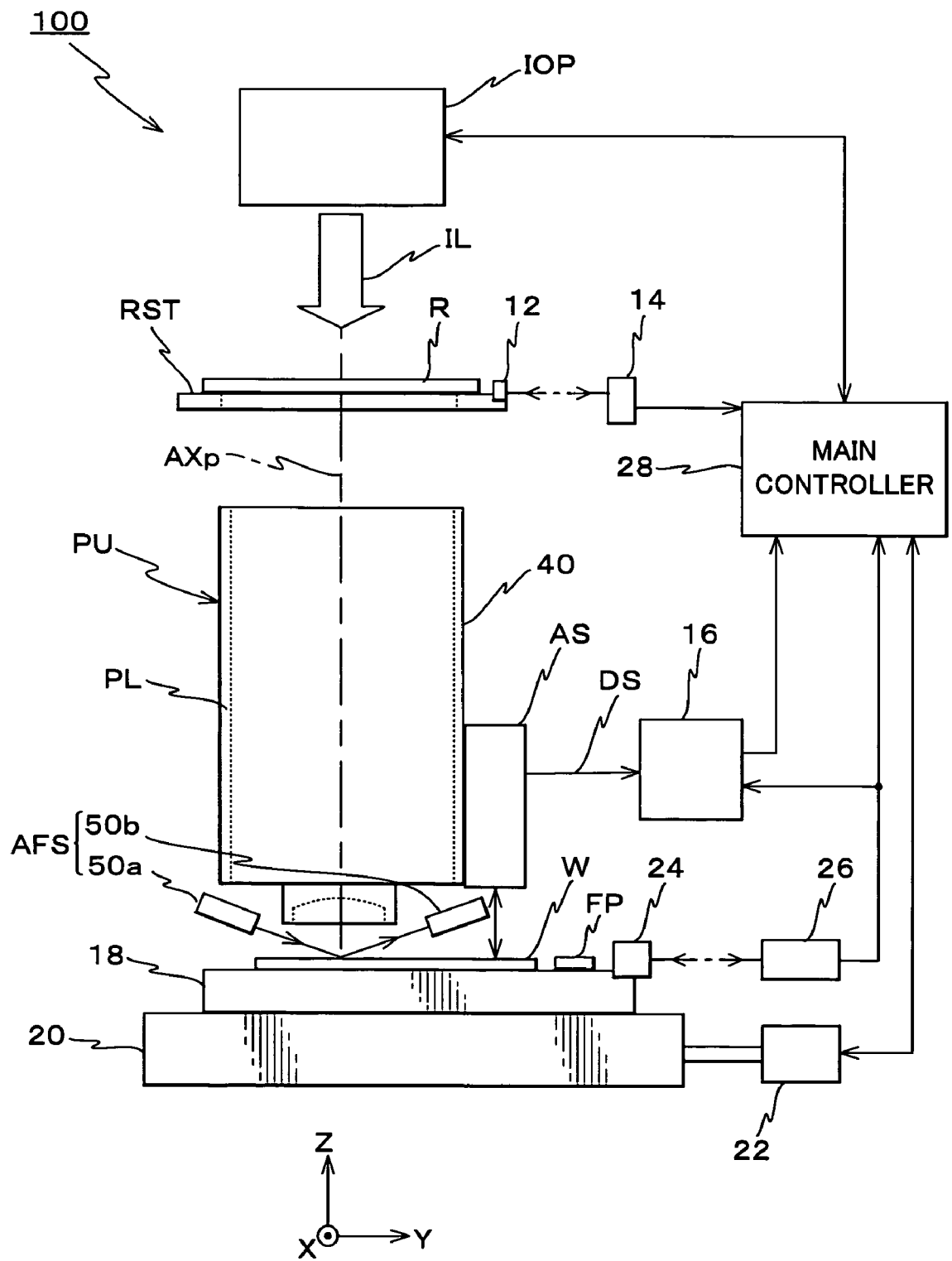
FIG. 1 is a view showing a schematic configuration of an exposure apparatus related to an embodiment.

FIG. 1 shows a schematic configuration of an exposure apparatus 100 related to the embodiment that is suitable to carry out an optical characteristics measurement method and an exposure method of the present invention. Exposure apparatus 100 is a reduced projection exposure apparatus by a step-and-scan method (a so-called scanning stepper (which is also called a scanner)).

Exposure apparatus 100 is equipped with an illumination system IOP, a reticle stage RST that holds a reticle R, a projection unit PU that projects an image of a pattern formed on reticle R onto a wafer W that is coated with a photosensitive agent (which is to be a positive resist in this case), an XY stage 20 that moves within an XY plane holding wafer W, a drive system 22 that drives XY stage 20, their control system and the like. The control system is mainly configured of a main controller 28 that includes a microcomputer (or a workstation) that performs overall control of the entire apparatus and the like.

Illumination system IOP includes a light source that is made up of, for example, an ArF excimer laser (output wavelength: 193 nm) (or a KrF excimer laser (output wavelength: 248 nm), or the like), an illumination optical system that is connected to the light source via a light-transmitting optical system. The illumination optical system includes an illuminance uniformity optical system including an optical integrator or the like, a beam splitter, a reticle blind and the like (none of which are shown), as is disclosed in, for example, Kokai (Japanese Unexamined Patent Application Publication) No. 2001-313250 (the corresponding U.S. Patent Application Publication No. 2003/0025890) and the like. The illumination optical system shapes a laser beam emitted from the light source and illuminates an illumination area having a slit shape elongated in an X-axis direction (an orthogonal direction to the page surface of FIG. 1) on reticle R with substantially uniform illuminance by the shaped laser beam (hereinafter, also referred to as an illumination light) IL.

Reticle stage RST is placed below illumination system IOP in FIG. 1. Reticle R is mounted on reticle stage RST. Reticle R is held by reticle stage RST by suction via a vacuum chuck (not shown) or the like. Reticle stage RST is finely drivable within a horizontal plane (the XY plane) and is also scanned in a predetermined stroke range in a scanning direction (which is to be a Y-axis direction that is a lateral direction in the page surface of FIG. 1 in this case) by a reticle stage drive system (not shown). Positional information of reticle stage RST is measured by a laser interferometer 14, which is externally placed, via a movable mirror 12 fixed to an end portion of reticle stage RST, and measurement values of laser interferometer 14 are supplied to main controller 28. Incidentally, instead of movable mirror 12, an end surface of reticle stage RST may be polished to form a reflections surface (which corresponds to a reflection surface of movable mirror 12).

Projection unit PU is placed below reticle stage RST in FIG. 1. Projection unit PU includes a barrel 40 and a projection optical-system PL that includes a plurality of optical elements held in a predetermined positional relation inside barrel 40 and projects a pattern of a first surface (an object plane) on a second surface (an image-forming plane). As projection optical system PL, a both-side telecentric reduction system, which is a dioptric system composed of a plurality of lens elements (omitted in the drawing) disposed in an optical axis AXp direction (a Z-axis direction), is used. Out of the lens elements, the specific number of lens elements are severally movable and controlled by an image-forming characteristics correction controller (not shown) based on commands from main controller 28, so that optical characteristics (including image-forming characteristics) of projection optical system PL such as the magnification, distortion, comma, curvature of field and the like are adjusted.

The projection magnification of projection optical system PL is to be a 1/4, as an example. Therefore, when reticle R is illuminated by illumination light IL with uniform illuminance as is described above, a pattern of reticle R within the illumination area is reduced by projection optical system PL and projected on wafer W, and a reduced image of the pattern is formed on a part of an area to be exposed (a shot area) on wafer W. On this operation, projection optical system PL forms the reduced image in a partial area within its field (i.e. an exposure area that is a slit-shaped area conjugate with the illumination area with respect to projection optical system PL). Incidentally, the image-forming characteristics correction controller described above is to move at least one optical element (lens element or the like) of projection optical system PL in order to adjust the optical characteristics of projection optical system PL, that is, the image-forming state of a pattern image on wafer W, but instead of or in combination with the movement, for example, at least one of the change in characteristics (such as the center wavelength, or the spectral width) of illumination light IL by control of the light source, and the movement of wafer W in the Z-axis direction parallel to optical axis AXp of projection optical system PL (and inclination with respect to the XY plane) may be performed.

A wafer table 18 is mounted on XY stage 20 and wafer W is held on wafer table 18 via a wafer holder (not shown) by vacuum suction or the like. Wafer table 18 finely drives the wafer holder holding wafer W in the Z-axis direction and an inclination direction with respect to the XY plane, and is also called a Z-tilt stage. A laser beam (a measurement beam) from a laser interferometer 26 is irradiated to a movable mirror 24 of wafer table 18, and based on a reflected light from movable mirror 24, positional information of wafer table 18 in directions of six degrees of freedom, that is positional information in the X-axis, the Y-axis and the Z-axis and rotational information around the X-axis, the Y-axis and the Z-axis (including yawing (a $\theta z$ rotation being a rotation around the Z-axis), pitching (a $\theta x$ rotation being a rotation around the X-axis), and rolling (a $\theta y$ rotation being a rotation around the Y-axis)) are measured. Incidentally, an end surface (a side surface) of wafer table 18 may be polished to form a reflection surface (which corresponds to a reflection surface of movable mirror 24).

Measurement values of laser interferometer 26 are supplied to main controller 28, and main controller 28 controls the position of wafer W in directions of six degrees of freedom by controlling XY stage 20 and wafer table 18 via drive system 22 based on the measurement values of laser interferometer 26.

Further, the position and the inclined quantity of a surface of wafer W in the Z-axis direction are measured by a focus sensor AFS that is composed of a multipoint focal position detection system based on an oblique incident method that has a light-transmitting system 50a and a photodetection system 50b, which is disclosed in, for example, Kokai (Japanese Unexamined Patent Application Publication) No. 06-283403 (the corresponding U.S. Pat. No. 5,448,332), and the like. Measurement values of focus sensor AFS are also supplied to main controller 28.

Further, a fiducial plate FP whose surface is set to be the same in height as the surface of wafer W is fixed on wafer table 18. On the surface of fiducial plate FP, fiducial marks used in baseline measurement and the like by an alignment detection system AS (to be described next) and the like are formed.

In the embodiment, alignment detection system AS based on an off-axis method that detects alignment marks formed on wafer W is arranged. As alignment detection system AS, an FIA (Field Image Alignment) system is used as an example, which is a type of alignment sensor based on an image processing method that illuminates a mark with a broadband light such as a halogen lamp or the like, and measures the mark position by performing the image processing of the mark image.

A detection signal DS of alignment detection system AS is supplied to an alignment controller 16, and alignment controller 16 performs A/D conversion of detection signal DS, and detects the mark position by performing arithmetic processing of the digitized waveform signal. This detection result is supplied from alignment controller 16 to main controller 28.

Moreover, although omitted in the drawing, in exposure apparatus 100 of the embodiment, a pair of reticle alignment detection systems based on a TTR (Through The Reticle) method that uses a light having the exposure wavelength, which is disclosed in, for example, Kokai (Japanese Unexamined Patent Application Publication) No. 07-176468 (the corresponding U.S. Pat. No. 5,646,413) and the like, are arranged above reticle R, and detection signals of the reticle alignment detection systems are supplied to main controller 28 via alignment controller 16.

Next, an example of a reticle that is used to measure the optical characteristics of the projection optical system in exposure apparatus 100 will be described.

Figure 2:
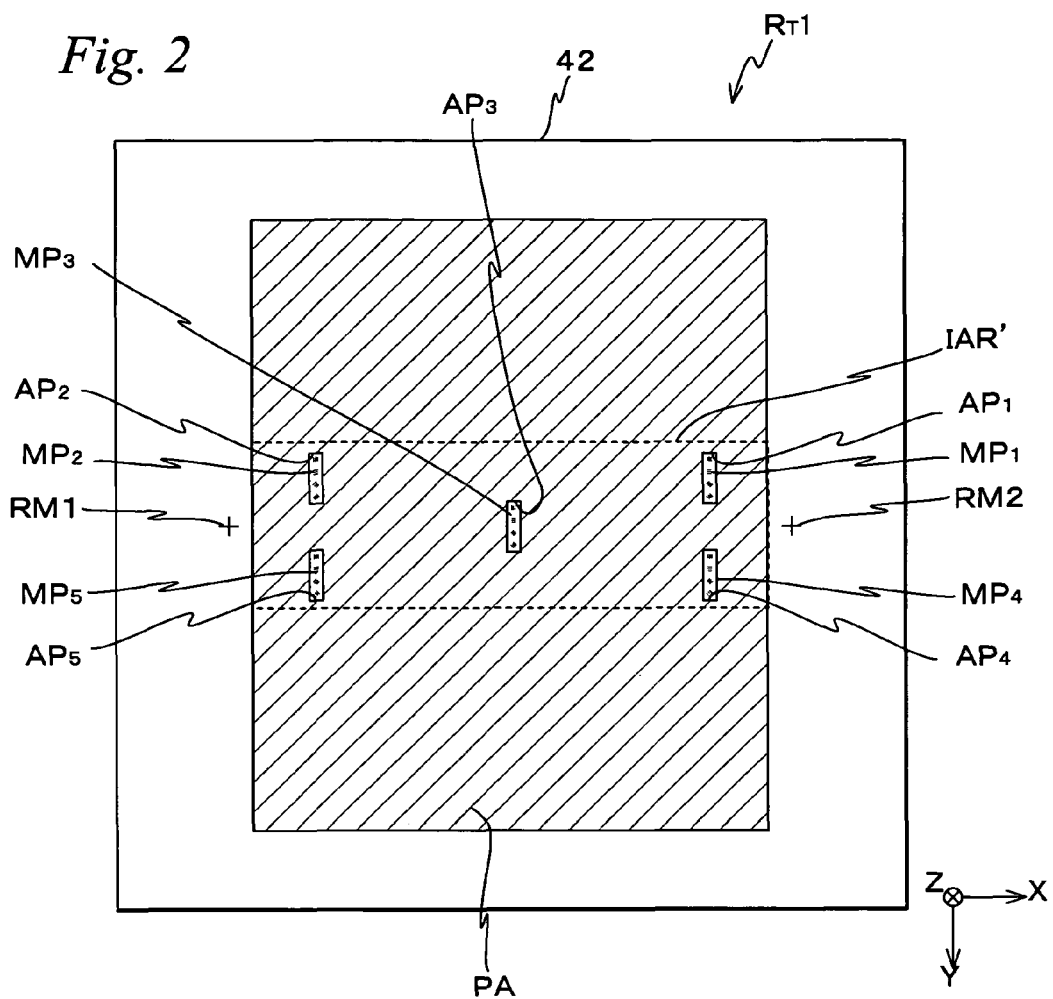
FIG. 2 is a plan view showing a reticle $R_T1$ when viewed from a pattern surface side.

In the embodiment, in order to measure the optical characteristics of projection optical system PL, trim exposure (which corresponds to the second exposure of double exposure), in which an image of a first pattern is exposed via a second pattern, is performed for the purpose of removing a part of the image of the first pattern, and therefore, two reticles $R_T1$ and $R_T2$ are used. FIG. 2 shows one of the two reticles, reticle $R_T1$. FIG. 2 is a plan view of reticle $R_T1$ when viewed from a pattern surface side (a lower surface side in FIG. 1). As is shown in FIG. 2, reticle $R_T1$ is composed of a glass substrate 42 having a rectangular shape (to be accurate, a square shape), and on its pattern surface, a pattern area PA having a substantially rectangular shape that is defined by a light-shielding zone (not shown) is formed, and in this example, the substantially entire surface of pattern area PA is made to be a light-shielding section by a light-shielding member such as chromium or the like. At five locations in total, which are the center of pattern area PA (which coincides with the center of reticle $R_T1$ (the reticle center) in this case), and four corner portions inside a virtual rectangular area IAR' whose center is on the reticle center and whose longitudinal direction is in the X-axis direction, aperture patterns (transmitting areas) $AP_1$ to $AP_5$ each having a predetermined width, e.g. 27 μm, and a predetermined length, e.g. 108 μm are formed, and patterns $MP_1$ to $MP_5$ are formed in aperture patterns $AP_1$ to $AP_5$ respectively. Rectangular area IAR' substantially coincides with the illumination area described above in size and shape. Incidentally, the substantially entire surface of pattern area PA is a light-shielding section in this example (the example in FIG. 2), but pattern area PA may be a light-transmitting section. In this case, since both ends of rectangular area IAR' in the X-axis direction are defined by the light-shielding zone referred to above, a light-shielding section having a predetermined width (e.g. the same width as the light-shielding zone) may be arranged at both ends of rectangular area IAR' in the Y-axis direction respectively.

Each of patterns $MP_n$ (n=1 to 5) includes dense patterns, for example, four types of line-and-space patterns (hereinafter, described as "L/patterns") $LS_{Vn}$, $LS_{Hn}$, $LS_{Rn}$ and $LS_{Ln}$, as is enlargedly shown in FIG. 3. Each of L/S patterns $LS_{Vn}$, $LS_{Hn}$, $LS_{Rn}$ and $LS_{Ln}$ is configured of a multi-bar pattern in which eight line patterns each having a predetermined width, e.g. 0.6 μm, and a predetermined length, e.g. around 9 μm, are disposed in a predetermined pitch, e.g. 1.2 μm in each periodic direction. In this case, the periodic directions of L/S patterns $LS_{Vn}$, $LS_{Hn}$, $LS_{Rn}$ and $LS_{Ln}$ are the X-axis direction, the Y-axis direction, a direction angled at +45 degrees with respect to the Y-axis and a direction angled at −45 degrees with respect to the Y-axis, respectively.

Figure 3:
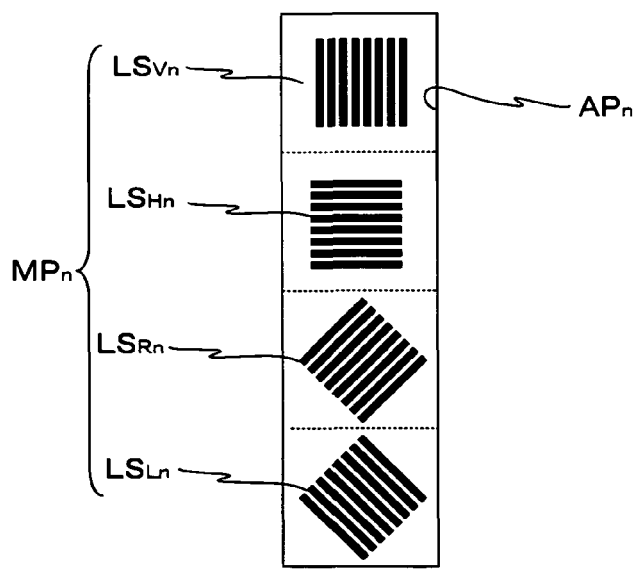
FIG. 3 is a view showing a configuration of a pattern $MP_n$ formed on reticle $R_T1$.

In the embodiment, in a square-shaped area (27 μm×27 μm) that is a quadrisection of aperture pattern $AP_n$ and enclosed by solid lines and (a) dotted line(s) shown in FIG. 3, L/S patterns $LS_{Vn}$, $LS_{Hn}$, $LS_{Rn}$ and $LS_{Ln}$ are placed respectively with their centers coinciding with the centers of the respective square-shaped areas. Incidentally, the boundaries indicated by dotted lines between the square-shaped areas do not actually exist.

Further, on both sides of pattern area PA in the X-axis direction that passes through the reticle center described above, a pair of reticle alignment marks RM1 and RM2 are formed (refer to FIG. 2).

Figure 4:
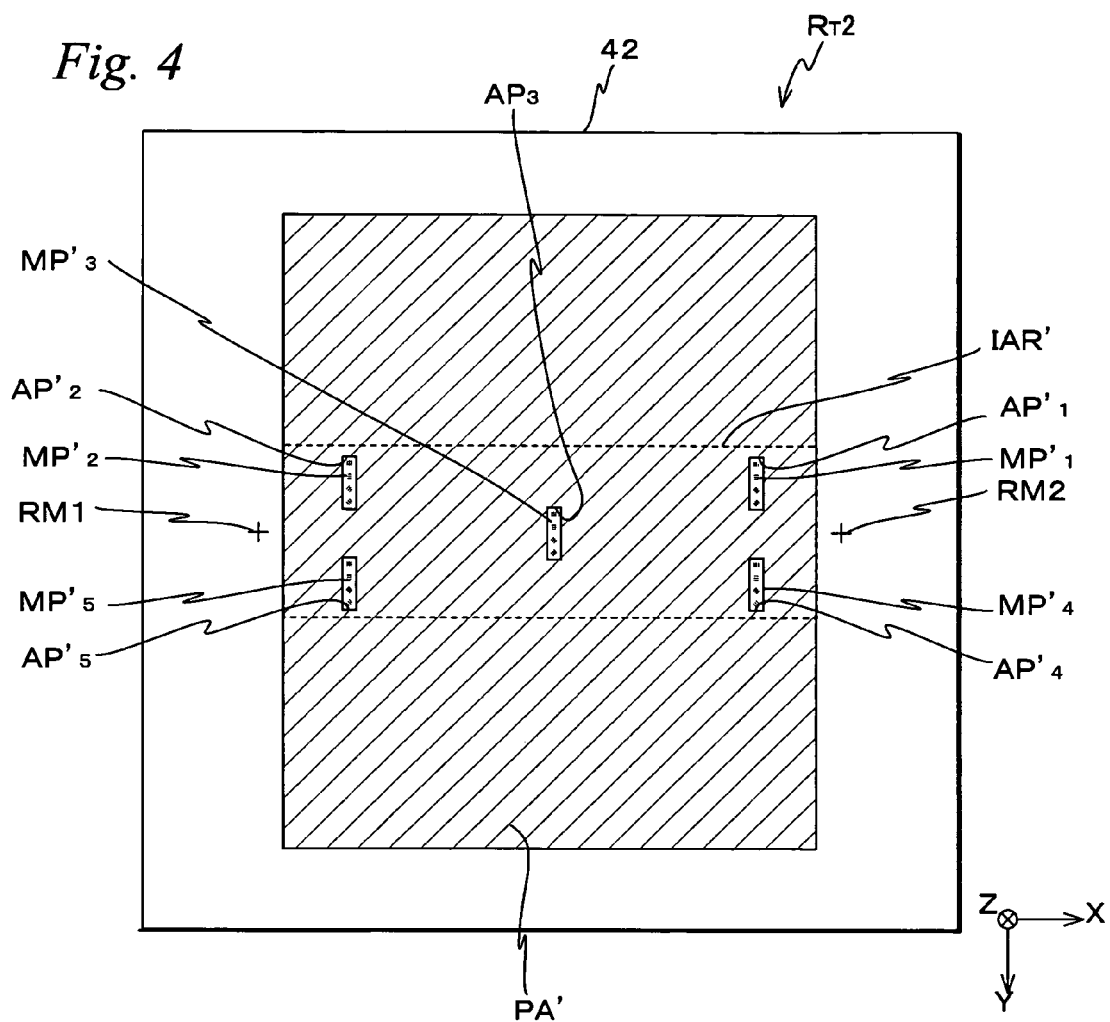
FIG. 4 is a plan view showing a reticle $R_T2$ when viewed from a pattern surface side.

FIG. 4 shows another reticle, reticle $R_T2$. FIG. 4 is a plan view of reticle $R_T2$ when viewed from a pattern surface side (a lower surface side in FIG. 1). As is shown in FIG. 4, reticle $R_T2$ has glass substrate 42 similarly to reticle $R_T1$, and on its pattern surface, a pattern area PA' that is defined by a light-shielding zone (not shown) and has the same shape and size as pattern area PA is formed, and the substantially entire surface of pattern area PA' is made to be a light-shielding section. In this example, however, patterns $MP'_1$ to $MP'_5$ are respectively formed inside aperture patters $AP'_1$ to $AP'_5$ which are the same in size and arrangement as aperture patterns $AP_1$ to $AP_5$. Incidentally, the entire surface of pattern area PA' may also be a light-transmitting section.

Figure 5:
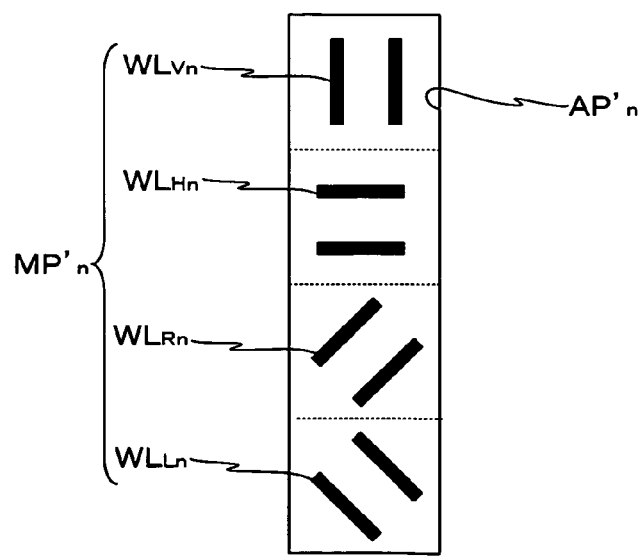
FIG. 5 is a view showing a configuration of a pattern $MP'_n$ formed on reticle $R_T2$.

Each of patterns $MP'_n$ (n=1 to 5) includes four types of patterns $WL_{Vn}$, $WL_{Hn}$, $WL_{Rn}$ and $WL_{Ln}$, as is enlargedly shown in FIG. 5. Each of patterns $WL_{Vn}$, $WL_{Hn}$, $WL_{Rn}$ and $WL_{Ln}$ is configured of a pattern in which two line patterns each having a predetermined width, e.g. 1.2 μm, and a predetermined length, e.g. around 9 μm, are placed parallel, spaced apart at a predetermined distance, for example, 4.8 μm. In this case, the directions in which the two line patterns of patterns $WL_{Vn}$, $WL_{Hn}$, $WL_{Rn}$ and $WL_{Ln}$ are disposed respectively are the X-axis direction, the Y-axis direction, a direction angled at +45 degrees with respect to the Y-axis and a direction angled at −45 degrees with respect to the Y-axis.

In the embodiment, in a square-shaped area (27 μm×27 μm) that is a quadrisection of aperture pattern $AP'_n$ and enclosed by solid lines and (a) dotted line(s) shown in FIG. 5, patterns $WL_{Vn}$, $WL_{Hn}$, $WL_{Rn}$ and $WL_{Ln}$ are placed respectively with their centers coinciding with the centers of the respective square-shaped areas. Incidentally, also in this case, the boundaries indicated by dotted lines between the square-shaped areas do not actually exist.

Next, a measurement method of the optical characteristics of projection optical system PL in exposure apparatus 100 of the embodiment will be described according to a flowchart in FIG. 6 that shows a simplified processing algorithm of a CPU within main controller 28, and also by using other drawings as needed.

Figure 6:
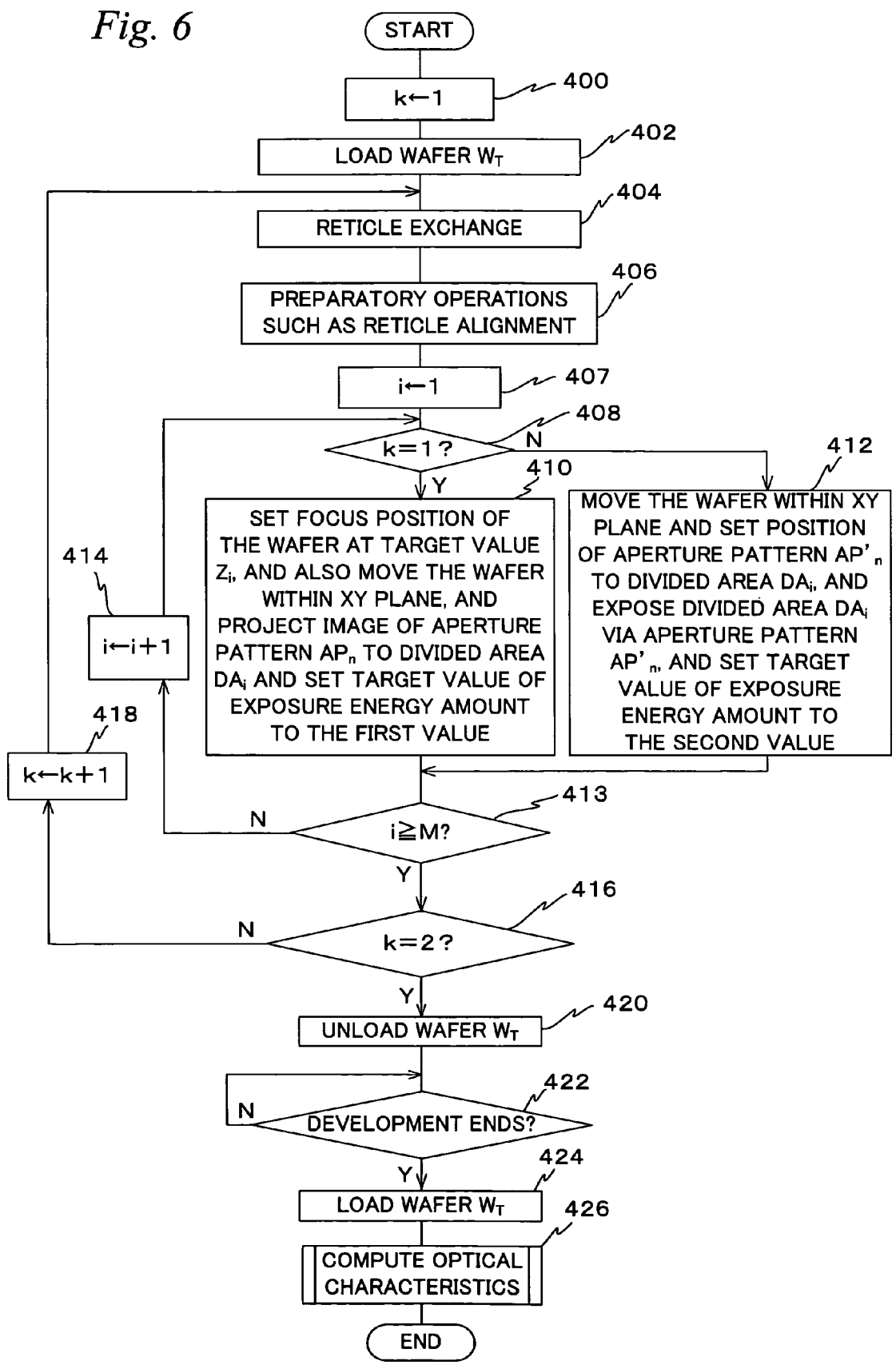
FIG. 6 is a flowchart used to explain a measurement method of optical characteristics related to the embodiment.

First of all, in step 400 in FIG. 6, a count value k of a first counter is initialized to one (k←1). The count value k shows the number of a reticle for measurement. The number of reticle $R_T1$ is "1" and the number of reticle $R_T2$ is "2".

Next, in step 402, wafer $W_T$ (refer to FIG. 8) is loaded on wafer table 18 via a wafer loader (not shown).

Next, in step 404, a reticle on reticle stage RST is exchanged for a $k^{th}$ reticle, which is a first reticle, reticle $R_T1$ in this case, via a reticle exchange mechanism (not shown). Incidentally, in the case where there is no reticle on reticle stage RST, reticle $R_T1$ is simply loaded.

In the next step, step 406, predetermined preparatory operations such as alignment of reticle $R_T1$ with projection optical system PL and the like are performed. To be specific, reticle stage RST and XY stage 20 are moved based on measurement values of leaser interferometers 14 and 26 respectively so that a pair of fiducial marks (not shown) of fiducial plate FP arranged on wafer table 18 and a pair of reticle alignment marks RM1 and RM2 of reticle $R_T1$ are detected by the reticle alignment detection systems described above (not shown). Then, based on detection results of the reticle alignment detection systems described above, the position (including the rotation) of reticle stage RST within the XY plane is adjusted. With this operation, rectangular area IAR' of reticle $R_T1$ is set within the above-described illumination area, and its entire surface is irradiated with illumination light IL. Further, in the embodiment, the position where a projected image of pattern $MP_n$ (a pattern image) is generated within the field (the exposure area in particular) via projection optical system PL serves an evaluation point where the optical characteristics (e.g. focus) should be measured within the exposure area of projection optical system PL. Incidentally, the number of the evaluation point may be at least one, but in the embodiment, five evaluation points in total, which are located in the center and in four corners of the exposure area described above, are set.

In this manner, when the predetermined preparatory operations end, a count value i of a second counter is initialized to one (i←1) in the next step, step 407. The count value i is used for setting of a target value $Z_i$ of the focus position (the position in the optical axis direction of projection optical system PL (the Z-axis direction)) of wafer $W_T$ in step 410 (to be described later), setting of a divided area $DA_i$ subject to exposure (refer to FIG. 7), and setting of a divided area $DA_i$ subject to exposure in step 412 (to be described later). In the embodiment, in step 410, for example, assuming a known best focus position (such as the design value) related to projection optical system PL as the center, the focus position of wafer $W_T$ is changed per $\Delta Z$ from $Z_1$ to $Z_M$ (M=15 as an example, $Z_i=Z_1$ to $Z_{15}$). Accordingly, in the embodiment, while changing the focus position of wafer $W_T$, M times of exposure (M=15 in this example) for sequentially transferring pattern $M_P$ (n=1 to 5) onto wafer $W_T$ are to be performed. In the embodiment, a projection area of aperture pattern $AP_n$ by projection optical system PL is referred to as a measurement pattern area, and a projected image of pattern $MP_n$ is generated within the measurement pattern area and aperture pattern $AP_n$ is transferred onto wafer $W_T$ by each exposure, thereby forming a divided area including the transferred image of pattern $MP_n$, Therefore, the 1×M number of patterns $MP_n$ are transferred to areas (hereinafter, referred to as "evaluation-point-corresponding areas") $DB_1$ to $DB_5$ on wafer $W_T$ (refer to FIG. 8) that correspond to the respective evaluation points within the exposure area (which corresponds to the illumination area described above) of projection optical system PL.

Figure 7:
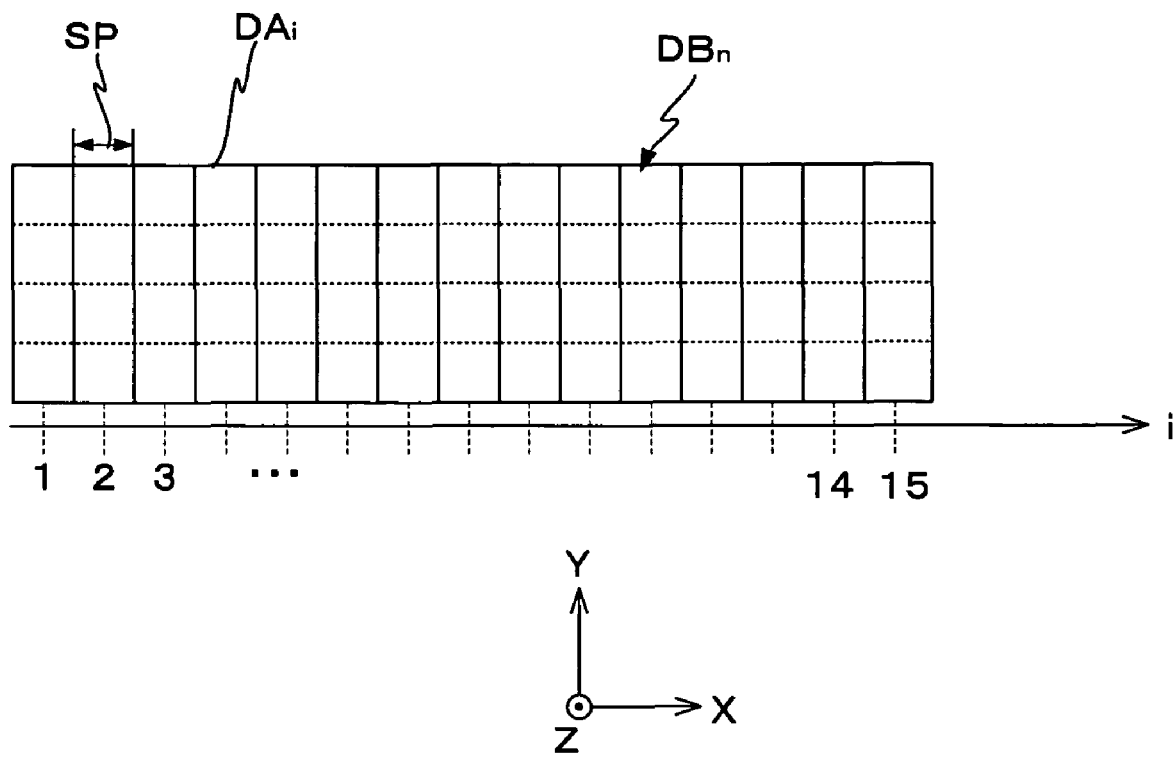
FIG. 7 is a view used to explain the arrangement of divided areas.

Each evaluation-point-corresponding area $DB_n$ on wafer $W_T$ to which pattern $MP_n$ is transferred by exposure (to be described later) will be described next for the sake of convenience, using FIG. 7, although the description is made out of sequence. As is shown in FIG. 7, in the embodiment, pattern $MP_n$ is transferred to each of the 1×M=M number (e.g. 1×15=15) of virtual divided areas $DA_i$ (i=1 to M (e.g. M=15)) that are placed in the matrix shape having 1 row and M columns (e.g. 1 row and 15 columns), and evaluation-point-corresponding area $DB_n$ that is composed of the M number (e.g. 15) of divided areas $DA_i$ to which pattern $MP_n$ has respectively been transferred is formed on wafer $W_T$. Incidentally, as is shown in FIG. 7, virtual divided areas $DA_i$ are disposed so that the +X direction serves as the column direction (the direction in which "i" increases). Further, the suffixes "i" and "M" that are used in the following description are to have the same meaning as described above.

Referring back to FIG. 6, in step 408, the judgment is made of whether or not the count value k is one. In this case, since the count value k of the first counter is initialized to one, the judgment in this step is affirmed and the procedure proceeds to step 410.

In step 410, wafer $W_T$ is moved to target position $Z_i$ ($Z_1$ in this case) in the Z-axis direction by driving wafer table 18 in the Z-axis direction while monitoring the measurement values from focus sensor AFS, and also wafer $W_T$ is moved within the XY plane and virtual divided area $DA_i$ ($DA_1$ in this case (refer to FIG. 7)) within each evaluation-point-corresponding area $DB_n$ (n=1, 2, ... 5) on wafer $W_T$ is exposed, thereby severally transferring an image of pattern $MP_n$ to the virtual divided area $DA_i$ ($DA_1$ in this case). When performing this operation, exposure dose control is performed so that the exposure energy amount (the total exposure dose) at one point on wafer $W_T$ becomes a target value. In the embodiment, a first value is set as the target value of the exposure energy amount in this case. The first value is an optimal value of the exposure energy amount that has been obtained in advance by, for example, an experiment, a simulation or the like.

Figure 8:
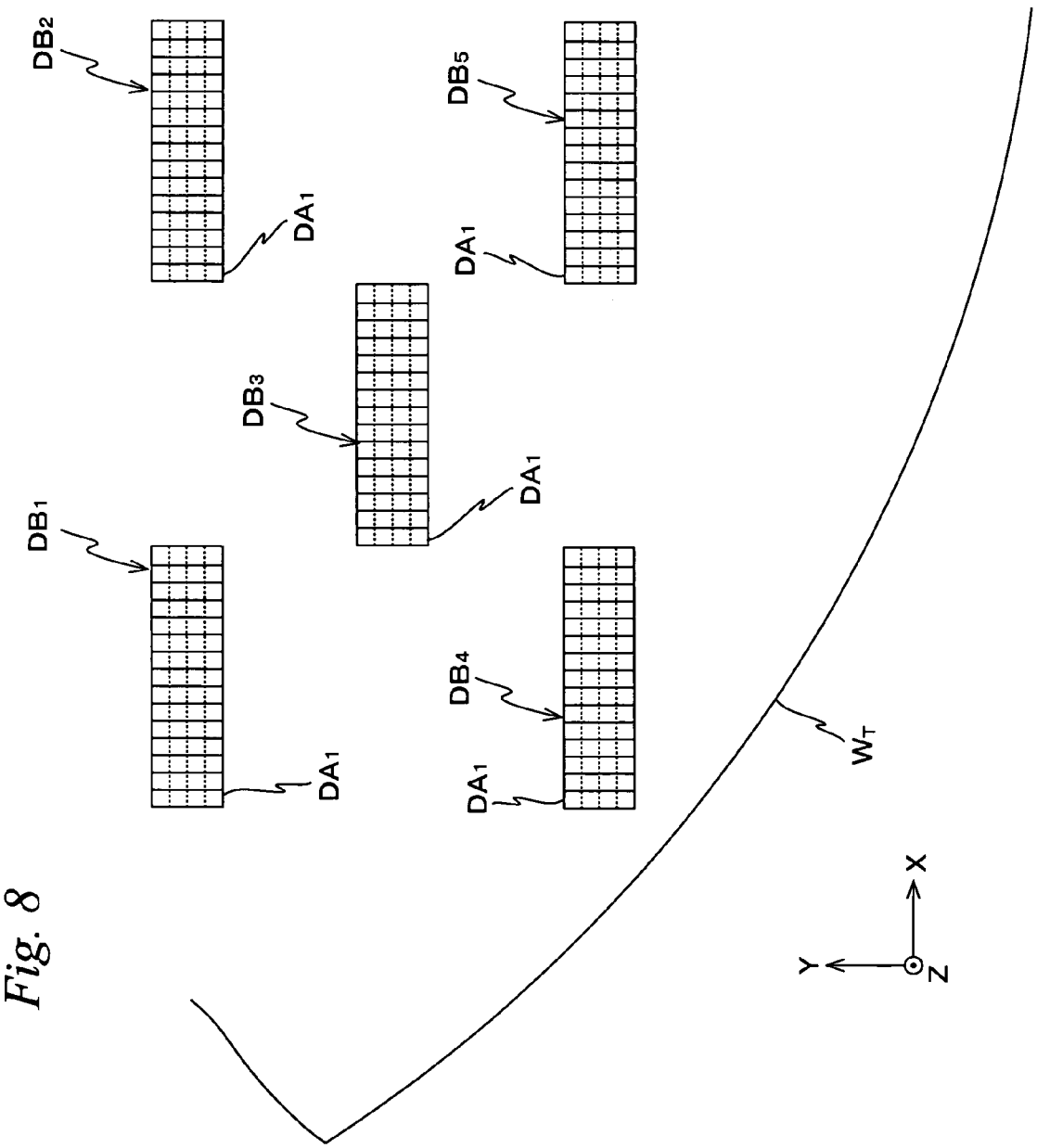
FIG. 8 is a view showing a state in which evaluation-point-corresponding areas $DB_1$ to $DB_5$ are formed on a wafer $W_T$.

With this operation, as is shown in FIG. 8, aperture pattern $AP_n$ including pattern $MP_n$ for measurement is respectively transferred to divided area $DA_1$ of each evaluation-point-corresponding area $DB_n$ on wafer $W_T$.

Referring back to FIG. 6, when exposure in step 410 described above ends, the procedure proceeds to step 413, in which the judgment is made of whether exposure to the planned number (M) of the divided areas ends or not, by judging whether or not the count value i is greater than or equal to M. In this case, because only exposure to the first divided area $DA_1$ ends, the procedure moves to step 414, and after the count value i is incremented by one (i←i+1), the procedure returns to step 408. In step 408, whether the counter value k is one or not is judged, but "k" is equal to one (k=1) in this case, and therefore, the judgment in step 408 is affirmed, and the procedure proceeds to step 410, in which wafer $W_T$ is moved to target value $Z_2$ of the focus position by driving wafer table 18 in the Z-axis direction, and also wafer $W_T$ is moved within the XY plane and virtual divided area $DA_2$ within each evaluation-point-corresponding area $DB_n$ (n=1, 2, ... 5) on wafer $W_T$ is exposed assuming the first value as the target value of the exposure dose, thereby severally transferring aperture pattern $AP_n$ including pattern $MP_n$ to virtual divided area $DA_2$. When performing this operation, prior to starting exposure, XY stage 20 is moved in a predetermined direction within the XY plane (the –X direction in this case) by a predetermined step pitch (which is to be "SP" (refer to FIG. 7)). In this case, in the embodiment, step pitch SP is set to around 6.75 μm, which substantially coincides with the size in the X-axis direction of a projected image (corresponding to the measurement pattern area described above) of each aperture pattern $AP_n$ projected on wafer $W_T$. Incidentally, step pitch SP is not limited to around 6.75 μm, but desirably has the size with which images of patterns $MP_n$ that are respectively transferred to adjacent divided areas do not overlap with each other and which is less than or equal to 6.75 μm, that is, the size in the X-axis direction of a projected image (corresponding to the measurement pattern area described above) of each aperture pattern $AP_n$ on wafer $W_T$.

In this case, since step pitch SP is less than or equal to the size in the X-axis direction of a projected image of aperture pattern $AP_n$ on wafer $W_T$, a frame line that is formed by a part of the image of aperture pattern $AP_n$ or a not-yet-exposed area does not actually exist in a boundary portion between divided area $DA_1$ and divided area $DA_2$ of each evaluation-point-corresponding area $DB_n$.

After that, until the judgment in step 413 is affirmed, the loop processing (including the judgment) of steps 413→414→408→410 are repeated. With this operation, aperture pattern $AP_n$ including pattern $MP_n$ is respectively transferred to divided areas $DA_i$ (i=3 to M) of each evaluation-point-corresponding area $DB_n$ on wafer $W_T$, with the focus position of the wafer being at "Zi". Also in this case, however, the frame line or the not-yet-exposed area does not exist in the boundary portion between adjacent divided areas for the same reason as described above.

Meanwhile, when exposure to divided area $DA_M$ ($DA_{15}$ in the embodiment) of each evaluation-point-corresponding area $DB_n$ ends and the judgment in step 413 described above is affirmed, the procedure moves to step 416. At the stage where the judgment in step 413 is affirmed, as is shown in FIG. 8, transferred images (latent images) of the M number (M=15 in this case) of patterns $MP_n$ (aperture patterns $AP_n$), which were transferred under different exposure conditions (the different focus positions of wafer $W_T$ in the embodiment), are formed in each evaluation-point-corresponding area $DB_n$ on wafer $W_T$. Incidentally, in actual, at the stage where the M number (15 in this case) of divided areas, in which transferred images (latent images) of patterns $MP_n$ are formed, are formed on wafer $W_T$, each evaluation-point-corresponding area $DB_n$ is formed. In the above description, however, the explanation is made as if there were evaluation-point-corresponding areas $DB_n$ beforehand on wafer $W_T$, in order to make the description understandable.

Referring back to FIG. 6, in step 416, whether the count value k of the first counter is two or not is judged. In this case, because "k" is equal to one (k=1), the judgment herein is denied and the procedure moves to step 418, in which the count value k is incremented by one (k←k+1), and then, the procedure returns to step 404. In step 404, a $(k-1)^{th}$ reticle mounted on the reticle stage is exchanged for a $k^{th}$ reticle. In this case, the first reticle $R_T1$ on reticle stage RST is exchanged for the second reticle $R_T2$. After that, in step 406, the preparatory operations described above are performed, and after the count value i of the second counter is initialized to one in step 407, whether or not the count value k of the first counter is equal to one (k=1) is judged. In this case, since "k" is equal to 2 (k=2), the judgment herein is denied and the procedure moves to step 412.

In step 412, wafer $W_T$ is moved within the XY plane, and aperture pattern $AP'_n$ including pattern $MP'_n$ is aligned with divided area $DA_i$ ($DA_1$ in this case (refer to FIG. 7)) within each evaluation-point-corresponding area $DB_n$ (n=1, 2, . . . 5) on wafer $W_T$, and divided area $DA_i$ is exposed via aperture pattern $AP'_n$. With this operation, multiple exposure of divided area $DA_i$, that is, double exposure of divided area $DA_i$, in which exposure by aperture pattern $AP_n$ described above is performed as first exposure and exposure by aperture pattern $AP'_n$ described above is performed as second exposure, is performed. In the embodiment, a second value is set as a target value of an exposure energy amount in the second exposure. The second value is a value that has been set in advance, and may be the same as the first value, but in the embodiment, the second value is made to be different from the first value. For example, the second value is a value with which the level of excessive exposure by the double exposure does not become too great (a value smaller than the first value). Further, on this operation, the focus position of wafer $W_T$ is set, for example, at "$Z_7$". By the processing of step 412, an image of pattern $MP'_n$ is transferred and overlaid to divided area $DA_i$ ($DA_1$ in this case) in which a latent image of pattern $MP_n$ has been already formed, and a part of the image of pattern $MP_n$ is removed after development. This point will be described later on.

When the exposure of step 412 described above ends, the procedure proceeds to step 413, in which whether or not exposure to the planned number (M) of the divided areas ends by judging whether or not the count value i is greater than or equal to M. In this case, because only exposure to the first divided area $DA_1$ ends, the procedure moves to step 414, and after the count value i is incremented by one (i←i+1), the procedure returns to step 408. In step 408, whether or not the counter value k is one is judged, but "k" is equal to two (k=2) in this case, and therefore the judgment herein is denied and the procedure proceeds to step 412. Then, the wafer is moved within the XY plane, divided area $DA_2$ within each evaluation-point-corresponding area $DB_n$ (n=1, 2, . . . 5) on wafer $W_T$ is exposed assuming the second value as the target value of exposure dose, and an image of aperture pattern $AP'_n$ including pattern $MP'_n$ is transferred and overlaid to divided area $DA_2$ in which a latent image of pattern $MP_n$ has been already formed. Also in this case, the focus position of wafer $W_T$ is still set at, for example, "$Z_7$". On this operation, prior to starting exposure, XY stage 20 is moved by a predetermined step pitch (which is to be "SP" (refer to FIG. 7)) in a predetermined direction within the XY plane (the −X direction in this case).

Afterwards, until the judgment in step 413 is affirmed, the loop processing (including the judgment) of steps 413→414→408→412 is repeated. With this operation, aperture pattern $AP'_n$ including pattern $MP'_n$ is respectively transferred to divided area $DA_i$ (i=3 to M) of each evaluation-point-corresponding area $DB_n$ on wafer $W_T$ with the focus position of the wafer being at "$Z_7$". With this operation, an image of pattern $MP'_n$ is transferred and overlaid to divided area $DA_i$ (i=3 to M) in which a latent image of pattern $MP_n$ has been already formed, and a part of the image of pattern $MP_n$ is removed after development.

When the judgment in step 413 is affirmed, whether or not the count value k of the second counter is two is judged again in step 416. In this case, because "k" is equal to two (k=2), the judgment herein is affirmed, and the procedure proceeds to step 420, in which wafer $W_T$ is unloaded from wafer table 18 via a wafer unloader (not shown), and also wafer $W_T$ is carried to a coater/developer (not shown) that is inline connected to exposure apparatus 100 using a wafer carrier system (not shown).

Figure 9:
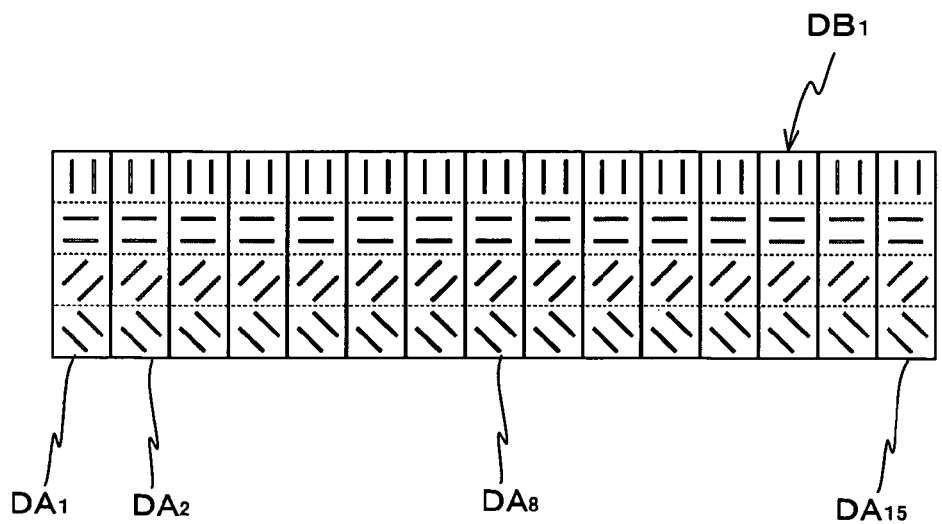
FIG. 9 is a view showing an example of a resist image of evaluation-point-corresponding area $DB_1$ formed on wafer $W_T$ after developing wafer $W_T$.

After the carriage of wafer $W_T$ to the coater/developer described above, the procedure proceeds to step 422 to wait until the development of wafer $W_T$ ends. During the waiting time in step 422, the development of wafer $W_T$ is performed by the coater/developer. By finishing the development, resist images of evaluation-point-corresponding areas $DB_n$ (n=1 to 5), in which an overlaid image that is obtained by overlaying the image of aperture pattern $AP'_n$ on the latent image of aperture pattern $AP_n$ is formed in each divided area $DA_i$, are formed on wafer $W_T$ and the wafer $W_T$ on which the resist images are formed serves as a sample used to measure the optical characteristics of projection optical system PL. FIG. 9 shows an example of a resist image of evaluation-point-corresponding area $DB_1$ formed on wafer $W_T$.

Figure 10:
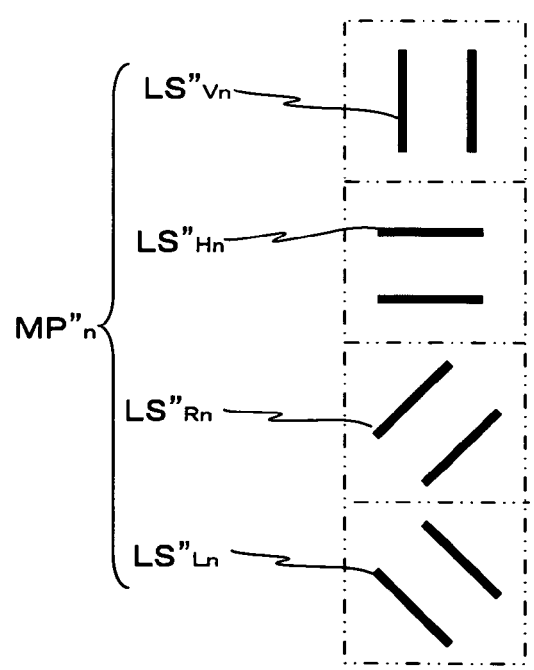
FIG. 10 is a view enlargedly showing a resist image formed in a divided area $DA_7$ shown in FIG. 9.

In FIG. 9, evaluation-point-corresponding area $DB_1$ is configured of the M number (=15) of divided areas $DA_i$ (i=1 to 15), and resist images of partition frames are shown between adjacent divided areas as if they exist, but they are shown only to make individual divided areas clear. In actual, however, the resist images of the partition frames do not exist between the adjacent divided areas. Since there are no frames as is described above, the decrease in contrast of the pattern section due to interference by the frames can be prevented from occurring, when capturing images of evaluation-point-corresponding areas $DB_n$ by alignment detection system AS described above or the like. Therefore, in the embodiment, the size of step pitch SP described previously is set to less than or equal to the size in the X-axis direction of a projected image of each aperture pattern $AP_n$ on wafer $W_T$. For example, in divided area $DA_8$ shown in FIG. 9, a resist image $MP''_n$ is formed, which includes four areas (hereinafter, referred to as "measurement mark areas" as needed) in which resist images $LS''_{Vn}$, $LS''_{Hn}$, $LS''_{Rn}$, and $LS''_{Ln}$ each composed of two line patterns as enlargedly shown in FIG. 10 are respectively formed. Incidentally, the boundaries between the measurement mark areas that are indicated by dotted lines within each divided area in FIG. 9 do not exist in actual either.

Next, the principle of forming resist image MP"$_n$ as is shown in FIG. 10 will be described in more detail.

Figure 11A:
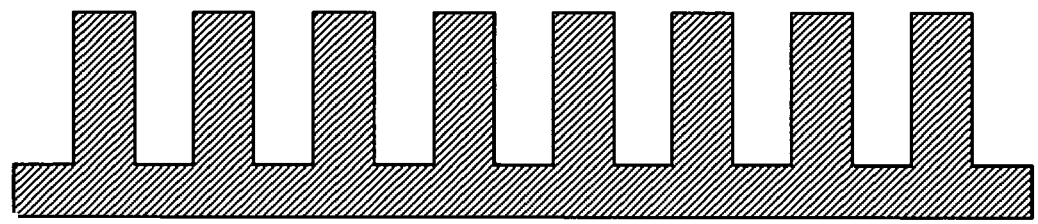
FIGS. 11A to 11C are views used to explain a principle of forming a resist image $MP'''_n$ as shown in FIG. 10.
Figure 11B:
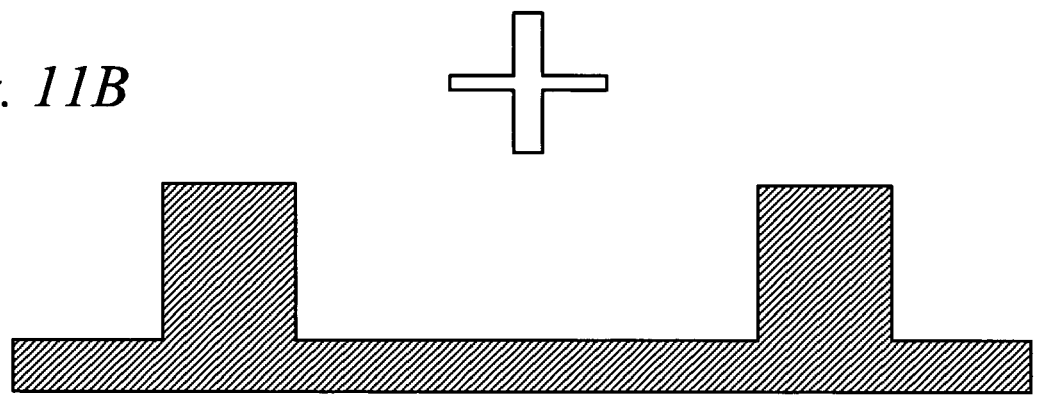

For example, in the case where only exposure using reticle R$_T$1 (the first exposure) is performed in the best focus state, a resist image having a cross sectional shape as modeled in FIG. 11A is formed in each measurement mark area of each divided area DA$_i$ after development of wafer W$_T$ whose surface is coated with a positive resist. Meanwhile, for example, in the case where only exposure using reticle R$_T$2 (the second exposure) is performed in the best focus state, a resist image having a cross sectional shape as modeled in FIG. 11B is formed in each measurement mark area of each divided area DA$_i$ after development of wafer W$_T$ whose surface is coated with a positive resist.

Figure 11C:
Figure 12:
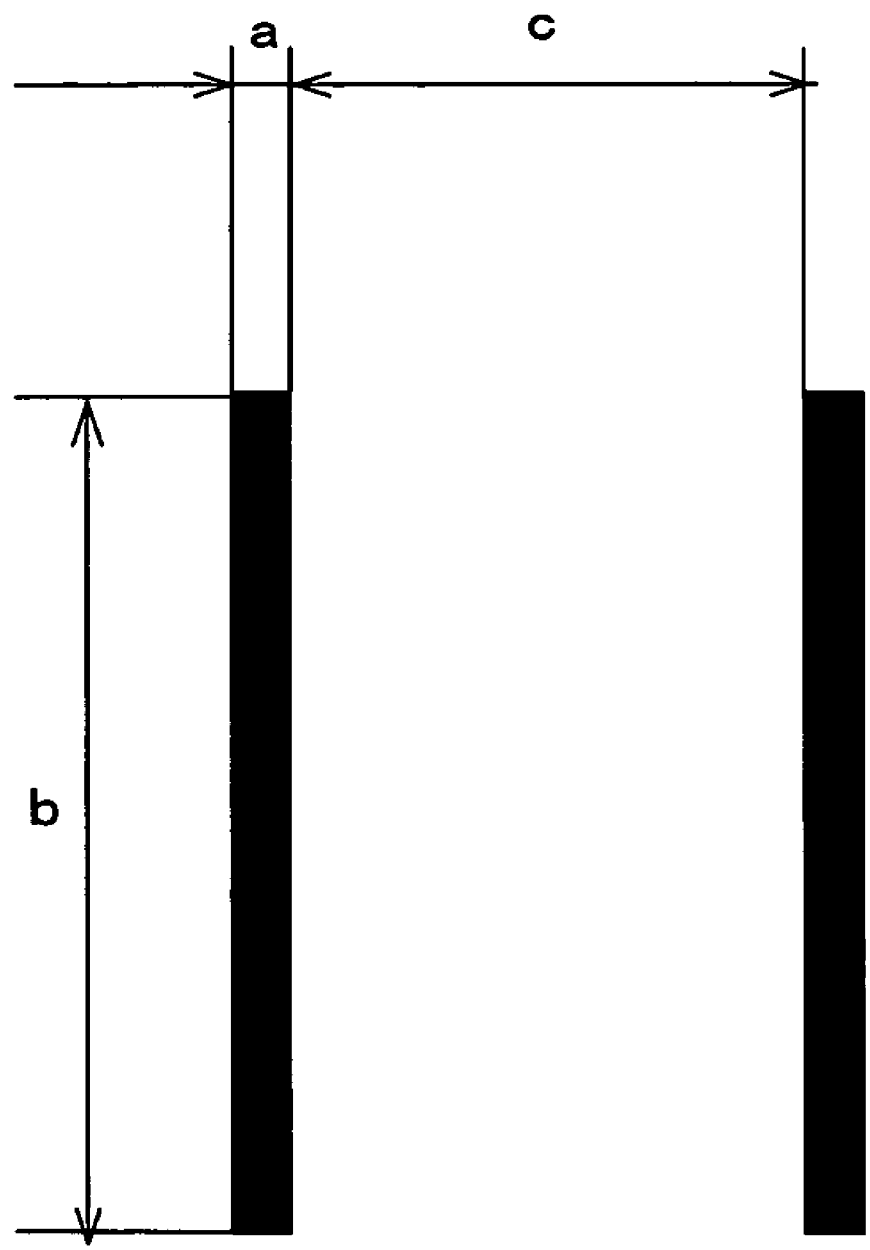
FIG. 12 is a view enlargedly showing a pattern image that representatively shows resist images $LS''_{Vn}$, $LS''_{Hn}$, $LS''_{Rn}$ and $LS''_{Ln}$ in FIG. 10.

In the embodiment, however, the double exposure described above is performed, that is, the first-time exposure using reticle R$_T$1 is performed in step 410 described above and the second-time exposure using reticle R$_T$2 is performed in step 412 described above. Accordingly, assuming that the first-time exposure has been performed in the substantially best focus state, an image that is an overlaid image of the image of FIG. 11A and the image of FIG. 11B is obtained, expressed in another way, a resist image having a cross sectional shape as modeled in FIG. 11C, which is a common portion of the image of FIG. 11A and the image of FIG. 11B, is obtained. As is shown in FIG. 12, the shape in a planar view of the resist image of FIG. 11C is a pattern image in which two line patterns each having a linewidth "a" (=0.15 μm) and a length "b" (=2.25 μm) are placed apart at a distance "c" (=1.35 μm). The pattern image of FIG. 12 representatively shows resist images LS"$_{Vn}$, LS"$_{Hn}$, LS"$_{Rn}$ and LS"$_{Ln}$. However, resist image MP"$_n$ formed by exposure in a defocus state loses its shape, or the linewidth changes. As a consequence, the resist image as is shown in FIG. 9 is obtained. As can be seen from FIGS. 11A to 11C, each resist image MP"$_n$ (resist images LS"$_{Vn}$, LS"$_{Hn}$, LS"$_{Rn}$ and LS"$_{Ln}$) shown in FIG. 10 is an image of a line pattern of a part of pattern MP (patterns LS$_{Vn}$, LS$_{Hn}$, LS$_{Rn}$ and LS$_{Ln}$), and has the same characteristics (such as the linewidth) as the image of pattern MP (patterns LS$_{Vn}$, LS$_{Hn}$, LS$_{Rn}$ and LS$_{Ln}$).

Referring back to FIG. 6, when confirming that the development of wafer W$_T$ ends by a notice from a control system of the coater/developer (not shown) in the waiting state in step 422, the procedure moves to step 424, and wafer W$_T$ is loaded again on wafer table 18 similarly to step 402 described above by transmitting instructions to a wafer loader (not shown), and then the procedure moves to a subroutine (hereinafter, also referred to as an "optical characteristics measurement routine") in step 426 in which the optical characteristics of the projection optical system are computed.

Figure 13:
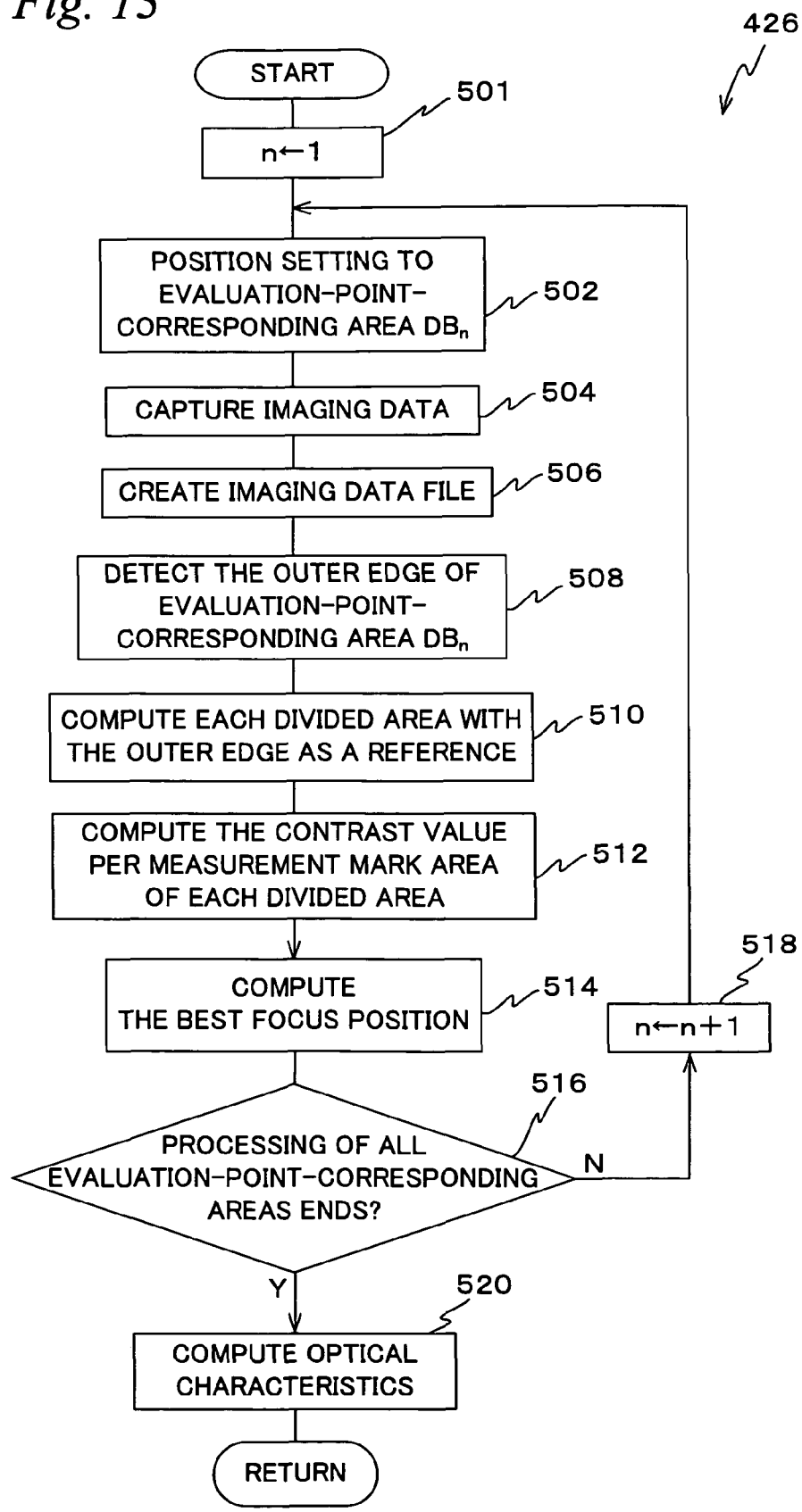
FIG. 13 is a flowchart showing details of step 426 (computation processing of optical characteristics) in FIG. 6.

In this optical characteristics measurement routine, first of all, in step 501 in FIG. 13, a count value n of a third counter that shows the number of an evaluation-point-corresponding area subject to detection is initialized to one (n←1).

Next, in step 502, by referring to the count value n of the third counter, wafer W$_T$ is moved to a position at which a resist image of evaluation-point-corresponding area DB$_n$ on wafer W$_T$ can be detected by alignment detection system AS. This movement, that is, the position setting is performed by controlling XY stage 20 via drive system 22 while monitoring measurement values of laser interferometer 26. In this case, because "n" is equal to one (n=1), the position of wafer W$_T$ is set at a position at which a resist image of evaluation-point-corresponding area DB$_1$ on wafer W$_T$ shown in FIG. 8 can be detected by alignment detection system AS. In the following description of the optical characteristics measurement routine, the resist image of evaluation-point-corresponding area DB$_n$ will be shortly referred to as "evaluation-point-corresponding area DB$_n$," as needed.

In the next step, step 504, the resist image of evaluation-point-corresponding area DB$_n$ (DB$_1$ in this case) on wafer W$_T$ is picked up using alignment detection system AS, and the imaging data is captured. Alignment detection system AS divides the resist image per pixel unit of an imaging device (such as CCD), and supplies the grayscale of the resist image corresponding to each pixel to main controller 28, for example, as 8-bit digital data (pixel data). That is, the imaging data described above is composed of a plurality of pixel data. In this case, the value of pixel data is to increase as the resist image is deeper in color (is closer to black). Incidentally, in the embodiment, since evaluation-point-corresponding area DB$_n$ has a size of 101.25 μm (in the X-axis direction)×27 μm (in the Y-axis direction) and its entire area is set within the detection area of alignment detection system AS, the M number of divided areas DA$_i$ can be imaged simultaneously (in block) per evaluation-point-corresponding area.

In the next step, step 506, the imaging data of the resist images formed in evaluation-point-corresponding area DB$_n$ (DB$_1$ in this case) from alignment detection system AS are properly arranged and an imaging data file is created.

In the next step, step 508, the outer edge of evaluation-point-corresponding area DB$_n$ (DB$_1$ in this case) is detected by performing the image processing of the imaging data. The detection of the outer edge can be performed as will be described below, as an example.

That is, by assuming a direct line portion constituting an outer frame composed of a contour of evaluation-point-corresponding area DB$_n$ as a detection subject and scanning a window area having a predetermined size in a direction substantially orthogonal to the direct line portion as the detection subject based on the imaging data obtained by the imaging, the position of the direct line portion as the detection subject is detected based on pixel data within the window area during the scanning. In this case, the pixel data of the outer frame portion is quite different in pixel value from that of other portions, and therefore, the position of the direct line portion (a part of the outer frame) as the detection subject can be detected without fail, for example, based on the change in pixel data within the window area according to the change of the position of the window area per one pixel in the scanning direction. In this case, the scanning direction is desirably a direction from the inside to the outside of the outer frame. This is because when the peak of the pixel values corresponding to the pixel data within the window area described above is obtained for the first time, that position coincides with the position of the outer frame without fail, and thus the outer frame detection can surely be performed.

The detection of the direct line portion as is described above is performed with respect to each of four sides constituting the outer frame composed of the contour of evaluation-point-corresponding area DB$_n$. The detection of the outer frame is disclosed in detail in, for example, Kokai (Japanese Unexamined Patent Application Publication) No. 2004-146702, the U.S. Patent Application Publication No. 2004/0179190, and the like.

In the next step, step 510, by equally dividing the outer edge of evaluation-point-corresponding area DB$_n$ detected above, that is, the internal section of the rectangular frame line into the M number (e.g. into 15) in the X-axis direction, divided areas DA$_1$ to DA$_M$ (DA$_{15}$) are obtained. That is, (positional information of) each divided area is obtained with the outer edge as a reference.

In the next step, step 512, brightness/darkness information per measurement mark area regarding each divide area DA$_i$ ($i=1$ to M), for example, the contrast value per measurement mark area (or the contrast value per divided area $DA_i$) is computed.

In this case, the contrast value per measurement mark area means the statistic expressed in the following equation (1), that is, the variance of the luminance value of each pixel regarding the measurement mark area.

$$C_1 = \frac{\sum_{k=1}^{N}(x_k - x^*)^2}{N-1} \quad (1)$$

Herein, $x_k$ denotes the luminance value of the $k^{th}$ pixel inside the measurement mark area, $x^*$ denotes a predetermined reference value. As the predetermined reference value, in the embodiment, the average value of luminance values of an area where there is no pattern image $MP'''_n$ (a pattern image for measurement) inside at least one divided area (or measurement mark area) on wafer $W_T$ is used. Further, N denotes the total number of pixels inside the measurement mark area.

Incidentally, as the contrast value, the standard deviation of the luminance value of each pixel regarding the measurement mark area expressed in the following equation (2) may also be used.

$$C_2 = \sqrt{\frac{\sum_{k=1}^{N}(x_k - x^*)^2}{N-1}} \quad (2)$$

Or, as the contrast value, another statistic including the deviation of the luminance value of each pixel with respect to the predetermined reference value described above may also be used for each measurement mark area (or each divided area).

Incidentally, in step 512, also in the case of computing the contrast value for each divided area, the variance, the standard deviation or another statistic of the luminance value of each pixel similar to the above-described case is used.

That is, in step 512, imaging data of each divided area $DA_i$ is extracted from the imaging data file described above, and the contrast value per measurement mark area in each divided area $DA_i$ ($i=1$ to M) (or the contrast value per divided area) is computed using the above equation (1) or (2).

Figure 14:
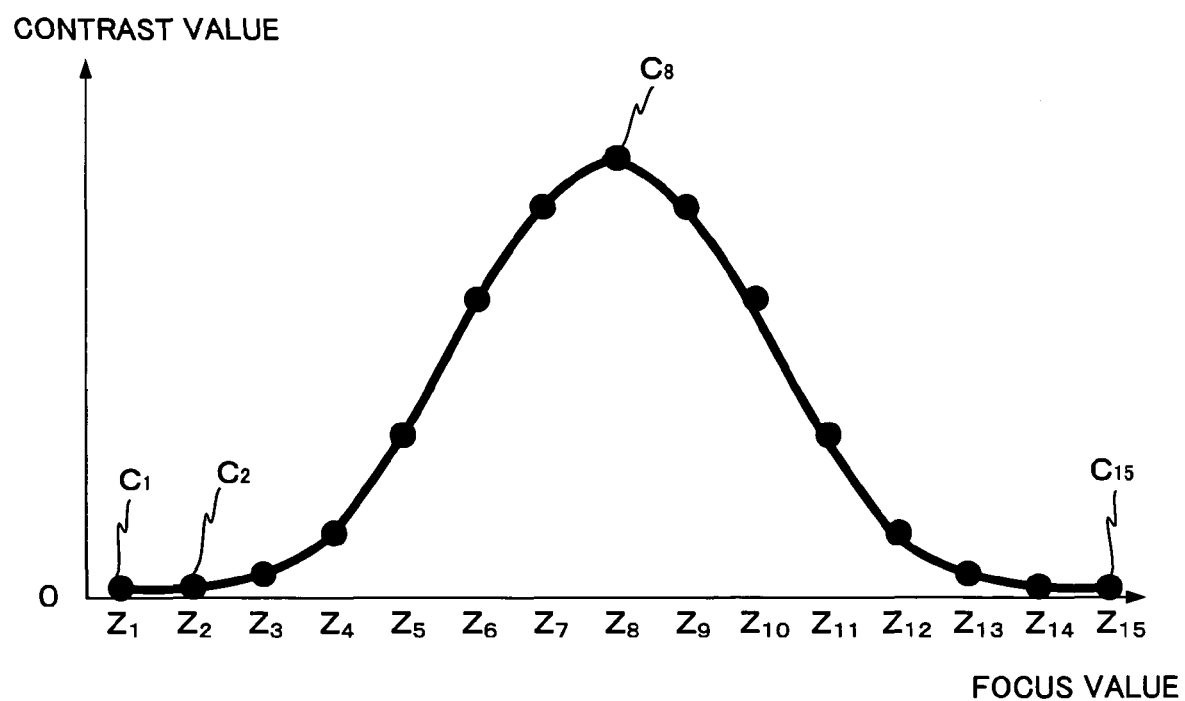
FIG. 14 is a view used to explain a way to obtain a best focus position.

In the next step, step 514, based on the contrast value computed in step 512 described above, the best focus position concerning evaluation-point-corresponding area $DB_n$ is computed in the manner described below and the best focus position is stored in a storage device (not shown). That is, regarding evaluation-point-corresponding area $DB_n$, the average value of the contrast values in the case of using four resist images $LS''_{Vn}$, $LS''_{Hn}$, $LS''_{Rn}$ and $LS''_{Ln}$ respectively is computed as the contrast value of each divided area $DA_i$ ($i=1$ to M) based on the contrast value per measurement mark area computed in step 512 described above. Next, regarding evaluation-point-corresponding area $DB_n$, the computed contrast value of each divided area $DA_i$ ($i=1$ to M) (or the contrast value per divided area computed in step 512 described above) is plotted on a graph having a horizontal axis that shows a focus value Z, as is shown in FIG. 14, and $Z_i$ ($Z_8$ in FIG. 14) corresponding to a plot point $C_i$ ($C_8$ in FIG. 14) where the contrast value becomes maximum out of the M number (15 in this case) of plot points is to be a best focus position $Z_{best}$. Or, regarding evaluation-point-corresponding area $DB_n$, for example, an approximate curve (hereinafter, referred to as a contrast curve), which is obtained by the least squares approximation of the plot points, is drawn as is shown in FIG. 14, and the average value of values at two intersecting points of the approximate curve with a predetermined slice level may be assumed to be best focus position $Z_{best}$.

In the next step, step 516, the judgment is made of whether the processing of all evaluation-point-corresponding areas $DB_1$ to $DB_5$ has ended or not, referring to the count value n described above. In this case, since only the processing of evaluation-point-corresponding area $DB_1$ has ended, the judgment in step 516 is denied, and after the procedure proceeds to step 518 and the count value n is incremented by one ($n \leftarrow n+1$), the procedure returns to step 502 and the position of wafer $W_T$ is set at a position where evaluation-point-corresponding area $DB_2$ can be detected by alignment detection system AS.

Then, the processing (including the judgment) of steps 504 to 514 described above is performed again, and the best focus position is obtained for evaluation-point-corresponding area $DB_2$ in the manner similar to the case of evaluation-point-corresponding area $DB_1$ described above.

Then, when the computation of the best focus position for evaluation-point-corresponding area $DB_2$ ends, whether the processing of all evaluation-point-corresponding areas $DB_1$ to $DB_5$ has ended or not is judged again in step 516, but the judgment is denied in this case. After that, until the judgment in step 516 is affirmed, the processing (including the judgment) in steps 502 to 518 described above is repeated. With this operation, the best focus position is respectively obtained for other evaluation-point-corresponding areas $DB_3$ to $DB_5$ in the manner similar to the case of evaluation-point-corresponding area $DB_1$ described above.

In this manner, when performing the computation of the best focus positions for all evaluation-point-corresponding areas $DB_1$ to $DB_5$ on wafer $W_T$, that is, the computation of the best focus positions at the respective evaluation points described above that serve as projection positions of five patterns $MP_1$ to $MP_5$ for measurement within the exposure area of projection optical system PL, the judgment in step 516 is affirmed. The optical characteristics measurement routine may be finished at this stage, but in the embodiment, the procedure moves to step 520, and other optical characteristics are computed based on the best focus position data obtained as is described above.

For example, in step 520, based on data of the best focus positions concerning evaluation-point-corresponding areas $DB_1$ to $DB_5$, the curvature of field of projection optical system PL is computed as an example. Further, other characteristics such as the depth of focus at each evaluation point within the exposure area described above may also be obtained.

Herein, in the embodiment, for simplification of the description, a single best focus position is to be obtained based on the average value of the contrast values of four types of resist images $LS''_{Vn}$, $LS''_{Hn}$, $LS''_{Rn}$ and $LS''_{Ln}$ in each evaluation-point-corresponding area (the position corresponding to each evaluation point), but the present invention is not limited thereto, and the best focus position may also be obtained with respect to each direction in which two line patterns are arranged (a periodic direction of the original L/S pattern) based on the contrast value of each resist image. Or, astigmatism at each evaluation point may also be obtained from the best focus positions that are respectively obtained for a pair of resist images (e.g. $LS''_{Rn}$ and $LS''_{Ln}$) which periodic directions are orthogonal to each other. Moreover, for each evaluation point within the exposure area of projection optical system PL, based on the astigmatism computed as is described above, regularity within the astigmatism surface can be obtained by performing the approximation processing, for example, in the least-squares method, and also the total focus difference can be obtained from the regularity within the astigmatism surface and the curvature of field.

Then, optical characteristics data of projection optical system PL obtained in the manner described above is stored in a storage device (not shown) and also displayed on the screen of a display device (not shown). With this operation, the processing of step 520 in FIG. 13, that is, the processing of step 426 in FIG. 6 is finished, and a series of measurement processing of the optical characteristics is finished.

Figure 15A:
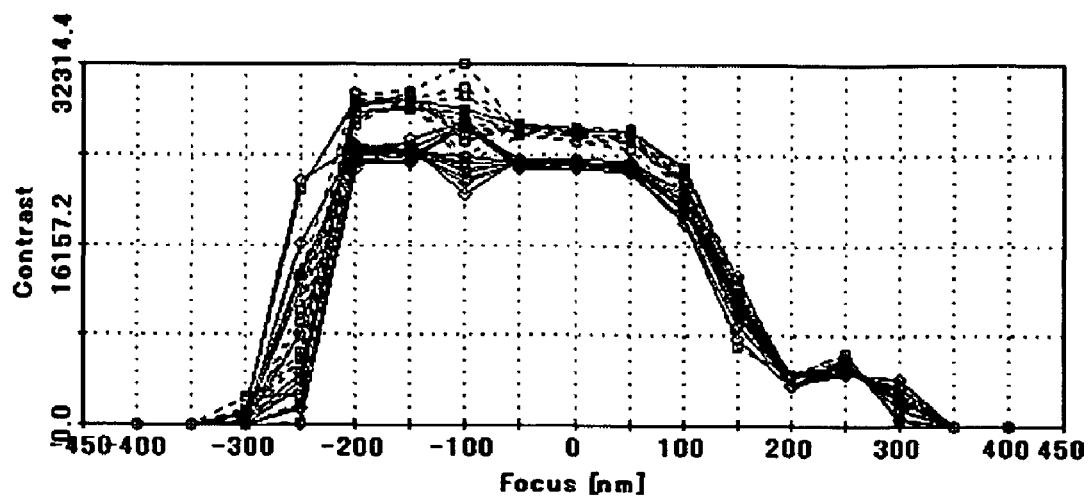
FIGS. 15A and 15B are views showing an example of a result of simulation which an inventor conducted.
Figure 15B:
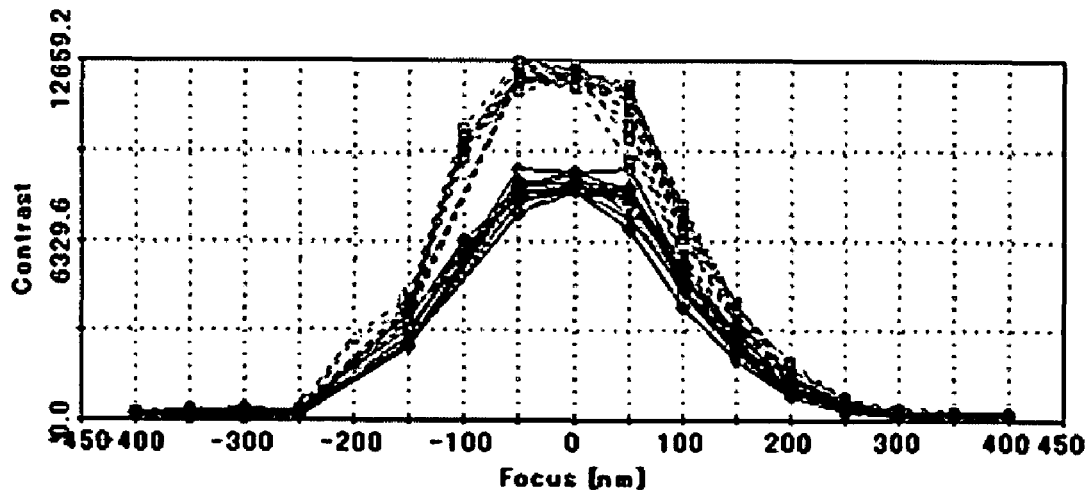

FIGS. 15A and 15B show an example of results of simulation that the inventor conducted. They are results of exposure simulation that was run assuming that a KrF excimer laser light source having a wavelength of 248 nm is employed as a light source, NA of the projection optical system is 0.82, and a normal illumination condition in which a coherence factor (σ value) is 0.9 is employed. Out of these drawings, FIG. 15A shows a contrast curve similar to FIG. 14, which is obtained in the case where one time exposure without trim exposure (the second exposure) that uses a halftone mask of an L/S pattern having a linewidth of 180 nm (the reduced value on the wafer) (a duty ratio (a ratio between a width of a line section and a width of a space section)=1:1) is performed in the procedures similar to the flowcharts of FIGS. 6 and 13 (however, the steps related to the count value k do not exist because only one mask is used). FIG. 15B shows a contrast curve that is obtained in the case where double exposure is performed similarly to the embodiment described above, and an L/S pattern having a linewidth of 150 nm and a duty ratio of 1:9 is formed on the wafer. In this case, a target value of an exposure energy amount of the first exposure is assumed to be 35 mJ and a target value of an exposure energy amount of the second exposure is assumed to be 4 mJ.

Since the contrast curve in FIG. 15A does not have a smooth mountain shape, it can be understood from the simulation of FIG. 15A that the linewidth of the resist image that is subject to measurement is a linewidth near an assumed resolution limit of the measurement device. On the contrary, it can be understood from FIG. 15B that a smooth mountain-shaped curve is obtained as the contrast curve and the best focus position can be obtained with high accuracy in spite of the fact that a resist image of a pattern having a linewidth thinner than the linewidth in the case of FIG. 15A, that is, less than or equal to the assumed resolution limit of the measurement device is formed.

Next, the exposure operation by exposure apparatus 100 in the embodiment in the case of device manufacturing will be described.

As a premise, information on the best focus position decided in the manner described above, or in addition to such information, information on the curvature of field has been input to main controller 28 via an input/output device (not shown).

For example, in the case where the information on the curvature of field is input, prior to exposure, main controller 28 instructs the image-forming characteristics correction controller (not shown) based on the optical characteristics data so as to correct the image-forming characteristics of projection optical system PL as much as possible in order to correct the curvature of field by changing, for example, the position (including the distance from other optical elements) or the inclination of at least one optical element (which is a lens element in the embodiment, but depending on the configuration of an optical system, for example, which may also be a catoptric element such as a concave mirror, or an aberration correcting plate that corrects aberration (such as distortion or spherical aberration), in particular, a non-rotational symmetric component thereof in projection optical system PL). In this case, as the correction method of image-forming characteristics of projection optical system PL, for example, a method of slightly shifting the center wavelength of illumination light IL, or a method of changing the refractive index in a part of projection optical system PL may be employed by itself or in combination with the movement of an optical element.

Then, main controller 28 loads reticle R on which a predetermined circuit pattern (device pattern) is formed that is subject to transfer onto reticle stage RST using the reticle loader (not shown), and similarly, loads wafer W onto wafer table 18 using the wafer loader (not shown).

Next, main controller 28 performs preparatory operations such as reticle alignment and baseline measurement in predetermined procedures using a reticle alignment detection system (not shown), fiducial plate FP on wafer table 18, alignment detection system AS and the like, and following such operations, wafer alignment based on, for example, the EGA (Enhanced Global Alignment) method or the like is performed.

When the wafer alignment described above ends, main controller 28 controls the respective sections of exposure apparatus 100 and scanning exposure of shot areas on wafer W and an inter-shot stepping operation are repeatedly performed, and the pattern of reticle R is sequentially transferred onto all the shot areas subject to exposure on wafer W.

During the scanning exposure described above, main controller 28 performs focus-leveling control of wafer W by driving wafer table 18 in the Z-axis direction and in the inclination directions (the θx and θy directions) via drive system 22 based on positional information of wafer W in the Z-axis direction detected by focus sensor AFS so that the surface of wafer W (shot areas) is set within a range of the depth of focus within the exposure area of projection optical system PL after the above-described correction of optical characteristics. In the embodiment, prior to the exposure operation of wafer W, the image plane of projection optical system PL has been computed based on the best focus position at each evaluation point described above, and based on the computation results, optical calibration of focus sensor AFS (such as adjustment of the inclination angle of a parallel plane plate placed within photodetection system 50b) has been performed. The present invention is not limited thereto, but, for example, the focus operation (and the leveling operation) may also be performed taking into consideration the offset in accordance with the deviation between the image plane computed in advance and the detection criterion of focus sensor AFS.

As is described above, according to the embodiment, by performing the processing of step 410 described above, an image (a latent image) of aperture pattern $AP_n$ including pattern $MP_n$ formed on reticle $R_T1$ is generated in each divided area $DA_i$ of each evaluation-point-corresponding area $DB_n$ on wafer $W_T$ via projection optical system PL, and each divided area $DA_i$ is exposed. In this case, an area of aperture pattern $AP_n$ other than pattern $MP_n$ is a light-transmitting section, and therefore, in actual an image (a latent image) of pattern $MP_n$ is formed in each divided area $DA_i$ of a resist layer (a positive resist) formed on wafer $W_T$. Then, by performing the processing of step 412 described above, a part of each divided area $DA_i$ on wafer $W_T$ in which the image of aperture pattern $AP_n$ (the image (the latent image) of pattern $MP_n$) is generated is respectively exposed via projection optical system PL, and a part of the image (the latent image) of pattern $MP_n$ is removed (a latent image that is obtained by deleting a part of the latent image of pattern $MP_n$ is formed in each divided area $DA_i$). Accordingly, after development of wafer $W_T$, an image (a resist image) $MP''_n$ that is obtained by removing a part of pattern $MP_n$ is formed in each divided area $DA_i$. In the embodiment, as a result of performing the processing of step 410 described above by making the focus position of wafer $W_T$ different with respect to each divided area $DA_i$ of each evaluation-point-corresponding area $DB_n$, after development of wafer $W_T$, a resist image similar to evaluation-point-corresponding area $DB_1$ shown in FIG. 9 is formed in each evaluation-point-corresponding area $DB_n$ on wafer $W_T$.

Then, in the optical characteristics measurement routine in step 426, the optical characteristics (the best focus position, the filed of curvature, the astigmatism and the like) of projection optical system PL are obtained by performing the processing in steps 501 to 520 using wafer $W_T$ after the development as a sample.

In this case, for example, image (resist image) $MP'''_n$ (refer to FIG. 10) of the pattern that is obtained by removing a part of pattern $MP_n$ that constitutes resist image $DB'_1$ is an image that is obtained by removing a partial section from the image of pattern $MP_n$, and therefore, even if image $MP'_n$ has a linewidth less than or equal to the measurement resolution of the measurement device (alignment detection system AS in the embodiment), image (resist image) $MP'''_n$ of the pattern can be measured using the measurement device. Accordingly, by computing the optical characteristics of the projection optical system based on the measurement result, it becomes possible to measure the optical characteristics in a short period of time.

Further, resist image $MP'''_n$ is a pattern image that is composed of a pattern obtained by removing a part of each L/S pattern of pattern $MP_n$ that is made up of the L/S patterns each having a linewidth less than or equal to the measurement resolution, and therefore, resist image $MP'''_n$ has the characteristics of an image of each L/S pattern of pattern $MP_n$ without change. Accordingly, for example, the best focus position measured for resist image $MP'''_n$ coincides with the best focus position of pattern $MP_n$. Thus, according to the embodiment, the optical characteristics of projection optical system PL can be measured with high precision using a measurement device whose measurement resolution is lower compared with the SEM or the like, for example, a measurement device such as alignment detection system AS of exposure apparatus 100 or the like. Accordingly, strict focusing as in the case of using the SEM becomes unnecessary, which allows the measurement time to be shortened.

Further, according to the embodiment, for a plurality of divided areas $DA_i$, in which image $MP'''_n$ that is obtained by removing a part of the image of pattern $MP_n$ is formed, of each evaluation-point-corresponding area $DB_n$ on wafer $W_T$, a predetermined statistic including the deviation with respect to a predetermined reference value of the luminance value of each pixel included in the imaging data obtained from the imaging of each evaluation-point-corresponding area $DB_n$, for example, the variance or the standard deviation is computed as the contrast, and based on the computation result of the contrast of each area that has been computed, the optical characteristics such as the best focus position (further, the field of curvature and the astigmatism) and the like at each evaluation point of projection optical system PL are obtained. Therefore, because the statistic described above is computed as the contrast, even a measurement device whose measurement resolution is lower compared with the SEM or the like, for example, a measurement device such as alignment detection system AS of exposure apparatus 100 or the like can perform the measurement. This allows the measurement time to be shortened. For example, also in the case of not imaging each evaluation-point-corresponding area $DB_n$ simultaneously as is described above but imaging each divided area separately, the measurement time per divided area can be shortened. Further, the measurement can be performed regardless of the types of projected image (pattern image) of pattern $MP_n$ (such as a line-and-space (an isolated line, a dense line), a contact hole, the size and the disposed direction), and regardless of illumination conditions when generating a pattern image.

Further, in the embodiment, because the contrast described above is detected, other patterns (such as a reference pattern for comparison, or a mark pattern for position setting) than pattern $MP_n$ do not have to be placed within pattern area PA of reticle $R_T1$ or the like. Further, the pattern for measurement can be reduced in size, compared with the conventional method of measuring the size (such as the CD/Focus method or the SMP focus measurement method). Therefore, the number of evaluation points can be increased, and also the distance between the evaluation points can be shortened. As a consequence, the measurement accuracy of the optical characteristics and the repeatability of the measurement results can be improved.

Further, according to exposure apparatus 100, the pattern formed on reticle R is transferred onto wafer W via projection optical system PL, after performing the operation related to adjustment of the image-forming state of the pattern image to be projected on wafer W via projection optical system PL, for example, adjustment of image-forming characteristics by movement of the optical element in projection optical system PL, or the calibration of focus sensor AFS, so that the optimal pattern generation can be performed taking into account the optical characteristics of projection optical system PL that are accurately measured in the measurement method described above.

Therefore, according to the exposure method related to the embodiment, the optical characteristics of projection optical system PL are measured with high precision using the above-described optical characteristics measurement method and the high-precision pattern image is generated within the exposure area of projection optical system PL taking the measurement results of the optical characteristics into consideration, and accordingly high-precision exposure (pattern transfer) is realized.

Incidentally, in the case where an isolated pattern is used as a pattern for measurement, the pattern image is formed by one-time exposure. On the contrary, a pattern image similar to the image of the isolated pattern can consequently be obtained by the double exposure described above in the embodiment, but the measurement of this pattern image can be carried out in the similar manner to the case of the isolated pattern although the characteristics of a dense pattern remains.

Incidentally, in the embodiment described above, the case has been described where four types of L/S patterns (multi-bar patterns) that are placed within aperture pattern $AP_n$ are used as pattern $MP_n$ (a dense pattern) on reticle $R_T1$, but the present invention is not limited thereto, and pattern $MP_n$ may include only one pattern in number or type, or an isolated line or a contact hole may also be used instead of or in combination with the L/S patterns. Further, in the case where the periodic pattern is used as pattern $MP_n$ for measurement, the periodic pattern is not limited to the L/S pattern, but for example, a pattern having dot marks that are periodically disposed may also be used. This is because the contrast described above is detected, which is different from the conventional method in which the linewidth of an image or the like is measured.

Further, in the embodiment described above, the entire area of each evaluation-point-corresponding area is to be simultaneously imaged, but for example, a plurality of sections of one evaluation-point-corresponding area may also be imaged separately. In this case, for example, the entire area of the evaluation-point-corresponding area is set within the detection area of alignment detection system AS and a plurality of sections of the evaluation-point-corresponding area may be imaged at different timing, or the plurality of sections of the evaluation-point-corresponding area are sequentially set within the detection area of alignment detection system AS and the imaging of the set section may be performed. Moreover, a plurality of divided areas that constitute one evaluation-point-corresponding area $DB_n$ are to be formed adjacent to each other, but for example, a portion of the evaluation-point-corresponding area (at least one divided area) may be formed apart from the other portions at a distance longer than or equal to a distance corresponding to the size of the detection area of alignment detection system AS described above. Further, in the embodiment described above, a plurality of divided areas are to be disposed in a row in each evaluation-point-corresponding area, but the positions of a plurality of divided areas in a direction (the Y-axis direction) orthogonal to the disposed direction (the X-axis direction) may be partially different, or for example, in the cases such as when the length of the evaluation-point-corresponding area in the disposed direction (the X-axis direction) is longer than the size of the detection area of alignment detection system AS, the divided areas may also be placed in a plurality of rows (i.e. two dimensionally) in each evaluation-point-corresponding area. That is, the placement (layout) of a plurality of divided areas may also be decided in accordance with the size of the detection area of alignment detection system AS so that the entire area of each evaluation-point-corresponding area can be simultaneously imaged. In this case, it is desirable to decide the step pitch in the Y-axis direction so that the frame line or the not-yet exposed portion referred to above does not exist also in the boundary portions of adjacent divided areas in the direction (the Y-axis direction) orthogonal to the disposed direction. Incidentally, pattern $MP_n$ for measurement is to be transferred onto wafer $W_T$ by static exposure in the embodiment described above, but scanning exposure may also be employed instead of static exposure, and in the case of the scanning exposure, dynamic optical characteristics can be obtained.

Further, exposure apparatus 100 of the embodiment may be a liquid immersion type exposure apparatus that is disclosed in, for example, the pamphlet of International Publication No. 99/49504, the U.S. Patent Application Publication No. 2005/0259234 and the like, and optical characteristics of the projection optical system also including liquid can be measured by transferring an image of pattern $MP_n$ for measurement onto a wafer via the projection optical system and the liquid.

Incidentally, in the embodiment described above, the case has been described where the variance or the standard deviation of the luminance value of each pixel per measurement mark area (or of each divided area $DA_i$), or another statistic including the deviation of the luminance value of each pixel with respect to a predetermined reference value concerning each measurement mark area (or each divided area) is used as the contrast value per measurement mark area (or of each divided area $DA_i$), but the present invention is not limited thereto. For example, information on the luminance value of each pixel concerning each measurement mark area (or each divided area) that does not include the above-described deviation, for example, a kind of statistic or the like related to the luminance value of each pixel such as the total value or the average value of the luminance values of the respective pixels within an area having a predetermined area size (a predetermined number of pixels) including the pattern image for measurement out of the measurement mark area (or the divided area) may also be employed as the contrast information. The point is that any statistic related to the luminance value of each pixel may be used in the case where the area size (such as the number of pixels) of the imaging area that is used for computation of the contrast information is made to be constant for each measurement mark area (or each divided area). Further, for example, in the case where the area size of the imaging area is set so as to contain the pattern image for measurement and also be smaller than or equal to around the area size of the measurement mark area (or the divided area), step pitch SP of wafer $W_T$ when transferring the pattern for measurement may be greater than the size in the X-axis direction of a projected image of each aperture pattern $AP_n$ on wafer $W_T$ (corresponding to the measurement pattern area described above).

Incidentally, in the embodiment described above, for example, the imaging subject may be a latent image that is formed on the resist when performing exposure, or may also be other images such as an image (an etching image) that is obtained by developing a wafer on which the latent image is formed and further performing the etching processing of the wafer. Further, the photosensitive layer on which an image is formed on an object such as a wafer is not limited to the photoresist, but may be any layer on which an image (a latent image and a visible image) is formed by irradiation of light (energy), and for example, an optical recording layer or a magnetooptical recording layer may also be employed.

Incidentally, in the embodiment described above, the optical characteristics (the best focus position and the like) of projection optical system PL are to be obtained by the contrast measurement, but the present invention is not limited thereto, and it is also effective even in a method of measuring a linewidth or the like of the image to employ the technique in which a pattern image that is obtained by removing a part of a pattern image having a linewidth (a space width) less than or equal to the measurement resolution by the trim exposure (the second exposure) described above serves as the measurement subject. Also in such a case, it is possible to measure a pattern image having a linewidth less than or equal to the resolution of a measurement device with high accuracy using the measurement device with which the measurement time can be shortened compared with the SEM or the like.

Further, in the embodiment described above, the double exposure for making a sample used for the optical characteristics measurement described above is to be performed using reticle $R_T1$ and reticle $R_T2$, but the present invention is not limited thereto. For example, a pattern area in which aperture pattern $AP_n$ including pattern $MP_n$ is placed and a pattern area in which aperture pattern $AP'_n$ including pattern $MP'_n$ is placed are formed in different portions of a same reticle, and the double exposure described above may also be performed using this reticle. Such double exposure can be realized by slightly changing the flowcharts described above. Or, instead of the second-time exposure using reticle $R_T2$, an energy beam is irradiated to a part of each divided area of each evaluation-point-corresponding area on wafer $W_T$ and an image (a latent image) of pattern $MP_n$ formed in each divided area may also be removed. In this case, the projection optical system does not have to be used in the second-time exposure, or different exposure apparatuses may be used in the first-time exposure and the second-time exposure.

Further, the order of the processing in step 410 and the processing of step 412 described above may be reversed. That is, in a state of maintaining the focus position of the wafer to a constant position similarly to the embodiment described above, an image of pattern $MP'_n$ is formed in each divided area $DA_i$ using reticle $R_T2$, and then the focus position is changed and overlay exposure may be performed to each divided area $DA_i$ using reticle $R_T1$.

Incidentally, in the embodiment described above, pattern $MP_n$ including L/S patterns $LS_{Vn}$, $LS_{Hn}$, $LS_{Rn}$ and $LS_{Ln}$ whose duty ratio, which is a ratio between a width of the line section and a width of the space section, is one is to be formed on reticle $R_T1$, and an image of pattern $MP_n$ is to be formed on wafer $W_T$ as a first pattern image by the first-time exposure, but the present invention is not limited thereto, and the first pattern image may also be an image of an isolated line pattern whose duty ratio is less than 1/3. Also in such a case, if the width of the space section is less than or equal to the width that is substantially the same as the resolution limit of a measurement device (e.g. alignment detection system AS), the trim exposure for the purpose of removal of a part of a pattern image described above is effective.

Further, in the embodiment described above, out of eight line sections of an image of L/S patterns $LS_{Vn}$, $LS_{Hn}$, $LS_{Rn}$, and $LS_{Ln}$, six line sections in total, which are one each at both ends and four in the center, are to be removed by the second-time exposure, but the present invention is not limited thereto, and at least one line section may be removed. Even if only one line section is removed, the pattern can be regarded as equivalent to an isolated pattern depending on the line width or the like, and measurement can be performed in a method similar to the case of the isolated pattern, and therefore the trim exposure for the purpose of removal of a part of a pattern image described above is effective. In the case where one line section is removed, the line section that should be removed needs to be set so that a line section in between is removed, that is, the line section that should be removed needs to be a line section other than the line sections located at both ends of the L/S pattern. In the case where two line sections are removed, at least one of the line sections that should be removed needs to be a line section except for the line sections located at both ends of the L/S pattern. Further, in the embodiment described above, two line sections are to remain after development as a result of the trim exposure, but the present invention is not limited thereto, and a part of each divided area on wafer $W_T$ in which an image of the L/S patterns is generated may be exposed via projection optical system PL so that at least one line section of the first pattern image (an image of L/S patterns $LS_{Vn}$, $LS_{Hn}$, $LS_{Rn}$ and $LS_{Ln}$ in the embodiment described above) remains.

Incidentally, when performing the second exposure in step 412 described above, the focus position of wafer $W_T$ does not necessarily have to be constant. The point is that the focus position may be changed as long as a part of the first pattern image can be removed without fail.

Incidentally, in the embodiment described above, an image formed in each divided area on the wafer is to be picked up using the alignment detection system of the exposure apparatus, but an apparatus other than the exposure apparatus, for example, an optical inspection apparatus or the like may also be used. Further, in the embodiment described above, a pattern image on the wafer is to be detected using the measurement device based on an imaging method (alignment detections system AS or the like), but a photodetection element (a sensor) of the measurement device is not limited to an imaging device such as a CCD and may include, for example, a line sensor or the like. In this case, the line sensor may be one-dimensional, but it is preferable to use line sensors that are two-dimensionally placed. Accordingly, data used in the computation of the contrast information described above (the measurement results of pattern images by the measurement device) is not limited to the imaging data. Moreover, in the embodiment described above, in the computation of the statistic (the contrast information, the brightness/darkness information) described above, the average value of the luminance values of a plurality of pixels (or the luminance value of a single pixel) in the area where no pattern images for measurement exist within at least one divided area (or measurement mark area) on the wafer is to be used as a predetermined reference value, but the predetermined reference value is not limited thereto. For example, the luminance value (including the average value) concerning the area other than the divided area (or the measurement mark area) or the average value or the like of the luminance values concerning the divided area (or the measurement mark area) may also be used. Further, the statistic that does not include the above-described deviation may be used as the contrast information as is described above, but for example, in the case where the linewidth (or pitch) of the pattern image for measurement is nearly equal or close to the resolution limit of the measurement device (the detection resolution of the optical system), it becomes difficult for the measurement device to sensitively detect the change in the linewidth of the pattern image for measurement, and therefore it is preferable to use, as the contrast information, the statistic described above that the above-described deviation can be obtained assuming the luminance value (or the average value thereof) of the area where the pattern image for measurement does not exist as the predetermined reference value. In this case, since the slight offset change that is obtained from the entirety of each L/S pattern of the pattern image for measurement is taken into consideration as the contrast value, the measurement accuracy can be improved.

Further, in the embodiment described above, positional information of wafer stage WST is to be measured using the interferometer system (26), but the present invention is not limited thereto, and for example, an encoder system that detects a scale (a diffraction grating) arranged on the upper surface of wafer stage WST may also used. In this case, it is preferable that a hybrid system equipped with both the interferometer system and the encoder system is employed and calibration of measurement results of the encoder system is performed using measurement results of the interferometer system. Further, the position control of the wafer stage may also be performed by switching the interferometer system and the encoder system to be used, or using both the systems.

Further, in the embodiment described above, the best focus position, the field of curvature, or astigmatism is to be obtained as the optical characteristics of the projection optical system, but the optical characteristics are not limited thereto and may be another aberration. Furthermore, the exposure apparatus of the embodiment described above is not limited to the exposure apparatus for manufacturing semiconductor devices, but may also be exposure apparatuses such as an exposure apparatus used when manufacturing other devices, for example, displays (such as liquid crystal display devices), imaging devices (such CCDs), thin film magnetic heads, micromachines, DNA chips or the like, and the present invention may also be applied to theses exposure apparatuses.

Incidentally, in the embodiment described above, a transmissive type mask (reticle), which is a transmissive substrate on which a predetermined light shielding pattern (or a phase pattern or a light attenuation pattern) is formed, is used, but instead of this mask, as is disclosed in, for example, U.S. Pat. No. 6,778,257, an electron mask (which is also called a variable shaped mask, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed may also be used. Further, the projection optical system is not limited to a dioptric system, but may also be either a catadioptric system or a catoptric system, and the magnification is not limited to the reduction system but may be either an equal magnifying system or a magnifying system. In addition, the projected image by the projection optical system may be either an inverted image or an upright image. Further, the present invention can also be applied to an exposure apparatus (a lithography system) that forms device patterns on wafer W by forming interference fringes on wafer W, as is disclosed in the pamphlet of International Publication No. 2001/035168. Moreover, the present invention can also be applied to an exposure apparatus that synthesizes two reticle patterns on a wafer via a projection optical system and almost simultaneously performs double exposure of one shot area on the wafer by one-time scanning exposure, as is disclosed in, for example, the U.S. Pat. No. 6,611,316. The point is that the present invention can be applied to any exposure apparatus that exposes an object by generating a pattern image for measurement within an exposure area of an optical system. Further, in the embodiment described above, a sensitive object (a substrate) subject to exposure to which an energy beam (such as illumination light IL) is irradiated is not limited to a wafer, but may be other objects such as a glass plate, a ceramic substrate, or a mask blank, and the shape of the object is not limited to a circular shape but may also be a rectangular shape.

Incidentally, the above disclosures of all the publications, the pamphlets of International Publications, the U.S. Application Publications, and the U.S. patents related to the exposure apparatus and the like that are cited in the embodiment above that are each incorporated herein by reference.

Semiconductor devices are manufactured through the following steps: a step where the function/performance design of a device is performed; a step where a reticle based on the design step is manufactured; a step where a wafer is manufactured using materials such as silicon; a step where an image of a pattern of the reticle is generated on the wafer by the exposure apparatus of the embodiment described above; a step where the wafer is developed; a step where etching is applied to the wafer after development; a device assembly step (including a dicing process, a bonding process, and a packaging process); an inspection step; and the like. In this case, in the lithography step, the exposure method described above is executed using the exposure apparatus of the embodiment described above and device patterns are formed on the wafer, and therefore, highly-integrated devices can be manufactured with high productivity.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A measurement method, comprising:
a first process of exposing an object by generating a first pattern image on the object via an optical system;
a second process of exposing a part of an area on the object where the first pattern image has been generated via the optical system;
a third process of measuring a pattern image that is formed on the object after processing of the second process using a measurement device; and
a fourth process of computing an optical characteristic of the optical system using a measurement result of the pattern image, wherein
in the second process, a part of the first pattern image is removed, in order to make the first pattern image, which is difficult to be measured by the measurement device, measureable.

2. The measurement method according to claim 1, wherein
in the second process, the part of the area on the object is exposed via the optical system by generating a second pattern image to be overlaid with the first pattern image.

3. The measurement method according to claim 2, wherein
in the first and second processes, the first and second pattern images are generated in each of a plurality of different areas on the object.

4. The measurement method according to claim 3, wherein
in the first process, the first pattern image is sequentially generated in the plurality of different areas on the object under a generation condition being changed, and
in the second process, the second pattern image is sequentially generated in the plurality of different areas on the object under a same generation condition being maintained.

5. The measurement method according to claim 4, wherein
the generation condition changed in the first process includes a position of the object with respect to the optical system in an optical axis direction of the optical system, and
the optical characteristic of the optical system computed in the fourth process includes a best focus position.

6. The measurement method according to claim 5, wherein
in the second process, the position of the object with respect to the optical system in the optical axis direction of the optical system is maintained at a same position.

7. The measurement method according to claim 3, wherein
in the first process, the first pattern image is sequentially generated in the plurality of different areas on the object under a same generation condition being maintained, and
in the second process, the second pattern image is sequentially generated in the plurality of different areas on the object under a generation condition being changed.

8. The measurement method according to claim 7, wherein
the generation condition changed in the second process includes a position of the object with respect to the optical system in the optical axis direction of the optical system, and
the optical characteristic of the optical system computed in the fourth process includes a best focus position.

9. The measurement method according to claim 8, wherein
in the first process, the position of the object with respect to the optical system in the optical axis direction of the optical system is maintained at a same position.

10. The measurement method according to claim 8, wherein the second pattern image has a duty ratio, which is a ratio between a width of the line section and a width of the space section, is less than 1/3.

11. The measurement method according to claim 10, wherein
the image of the line-and-space pattern has the space section whose width is less than or equal to a substantially same width as a resolution limit of the measurement device.

12. The measurement method according to claim 7, wherein
the second pattern image is an image of a line-and-space pattern in which a line section and a space section are placed with a predetermined period.

13. The measurement method according to claim 12, wherein
the image of the line-and-space pattern has the space section whose width is less than or equal to a substantially same width as a resolution limit of the measurement device.

14. The measurement method according to claim 2, wherein
the second pattern image is an image of a line-and-space pattern in which a line section and a space section are placed with a predetermined period.

15. The measurement method according to claim 14, wherein
the image of the line-and-space pattern has the space section whose width is less than or equal to a substantially same width as a resolution limit of the measurement device.

16. The measurement method according to claim 1, wherein
the first pattern image is an image of a line-and-space pattern in which a line section and a space section are placed with a predetermined period.

17. The measurement method according to claim 16, wherein
the first pattern image has a duty ratio, which is a ratio between a width of the line section and a width of the space section, is less than 1/3.

18. The measurement method according to claim 16, wherein
the image of the line-and-space pattern has the space section whose width is less than or equal to a substantially same width as a resolution limit of the measurement device.

19. The measurement method according to claim 16, wherein
in the second process, a part of an area on the object where the image of the line-and-space pattern is generated is exposed via the optical system so that at least one of the line section is removed.

20. The measurement method according to claim 16, wherein
in the second process, a part of the area on the object where the image of the line-and-space pattern is generated is exposed via the optical system so that at least one of the line section remains.

21. The measurement method according to claim 1, wherein
in the third process, a pattern image that is formed on the object after processing of the second process is picked up using the measurement device, and
in the fourth process, an optical characteristic of the optical system is computed using imaging data obtained by the image pickup.

22. The measurement method according to claim 21, wherein
in the fourth process, contrast information of an area on the object where the first pattern image is generated is computed, and based on the computed contrast information, an optical characteristic of the optical system is computed.

23. An exposure method, comprising:
a process of measuring an optical characteristic of an optical system by the measurement method according to claim 1; and
a process of adjusting at least one of an optical characteristic of the optical system and a position of the object in an optical axis direction of the optical system taking a measurement result of the optical characteristic into consideration, and also exposing the object via the optical system.

24. A device manufacturing method, including:
a process of forming a pattern on an object using the exposure method according to claim 23; and
a process of processing the object on which the pattern is formed.

25. A measurement method of measuring an optical characteristic of an optical system that projects a pattern of a first surface on a second surface, the method comprising:
performing multiple exposure to each of a plurality of areas on an object by performing exposure to form a dense pattern image on the object via the optical system at each of different positions in an optical axis direction of the optical system and exposure to remove a part of the dense pattern image; and
measuring brightness/darkness information of a pattern image in each of the plurality of areas.

26. The measurement method according to claim 25, further comprising:
developing the object that has been exposed, wherein brightness/darkness information of a pattern image formed in each of the plurality of areas after the development is measured.

27. The measurement method according to claim 25, wherein the pattern image subject to measurement is an isolated pattern.

28. The measurement method according to claim 25, wherein
the dense pattern image has a linewidth that is less than or equal to a resolution limit of a measurement device of the pattern image.

29. The measurement method according to claim 25, wherein
the dense pattern image is a line-and-space pattern image, and the pattern image subject to measurement is an image that is obtained by removing at least one line section except for line sections located at both ends from the line-and-space pattern image.

30. An exposure method, comprising:
a process of measuring an optical characteristic of an optical system by the measurement method according to claim 25; and
a process of adjusting at least one of an optical characteristic of the optical system and a position of the object in an optical axis direction of the optical system taking a measurement result of the optical characteristic into consideration, and also exposing the object via the optical system.

31. A device manufacturing method, including:
- a process of forming a pattern on an object using the exposure method according to claim 30; and
- a process of processing the object on which the pattern is formed.

32. The measurement method according to claim 25, wherein the brightness/darkness information is a contrast value.

33. The measurement method according to claim 25, wherein the brightness/darkness information is a contrast value in accordance with the following equation:

$$C_1 = \frac{\sum_{k=1}^{N}(x_k - x^*)^2}{N-1}, \qquad (1)$$

wherein $x_k$ denotes the luminance value of the $k^{th}$ pixel and $x^*$ denotes a predetermined reference value.

* * * * *